United States Patent
Higashisaka et al.

(10) Patent No.: US 9,200,362 B2
(45) Date of Patent: Dec. 1, 2015

(54) SUBSTRATE HOLDER STOCKER DEVICE, SUBSTRATE PROCESSING APPARATUS, AND SUBSTRATE HOLDER MOVING METHOD USING THE SUBSTRATE HOLDER STOCKER DEVICE

(75) Inventors: Ryuji Higashisaka, Kawasaki (JP); Hiroshi Sone, Sagamihara (JP)

(73) Assignee: Canon Anelva Corporation, Kawasaki-shi (JP)

( * ) Notice: Subject to any disclaimer, the term of this patent is extended or adjusted under 35 U.S.C. 154(b) by 970 days.

(21) Appl. No.: 13/177,735

(22) Filed: Jul. 7, 2011

(65) Prior Publication Data

US 2012/0006257 A1    Jan. 12, 2012

(30) Foreign Application Priority Data

Jul. 9, 2010    (JP) .................... 2010-156324

(51) Int. Cl.
   H01L 21/677    (2006.01)
   C23C 14/56    (2006.01)
   C23C 14/50    (2006.01)

(52) U.S. Cl.
   CPC ............... *C23C 14/568* (2013.01); *C23C 14/50* (2013.01); *H01L 21/67781* (2013.01)

(58) Field of Classification Search
   CPC .............................................. H01L 21/67781
   USPC ......... 414/404, 416.04, 416.11, 749.2, 749.5, 414/938
   See application file for complete search history.

(56) References Cited

U.S. PATENT DOCUMENTS

| | | | |
|---|---|---|---|
| 4,699,556 A * | 10/1987 | Foulke | 414/404 |
| 4,986,729 A * | 1/1991 | Ohlenbusch | 414/787 |
| 7,625,450 B2 | 12/2009 | Furukawa et al. | |
| 7,935,187 B2 | 5/2011 | Furukawa et al. | |
| 8,202,034 B2 * | 6/2012 | Sone et al. | 414/226.01 |
| 8,920,107 B2 * | 12/2014 | Ikeda | H01L 21/67718 414/938 |
| 2009/0308317 A1 | 12/2009 | Sone et al. | |
| 2010/0129539 A1 | 5/2010 | Higashisaka et al. | |
| 2011/0052349 A1 | 3/2011 | Sone et al. | |
| 2011/0168086 A1 | 7/2011 | Higashisaka et al. | |
| 2011/0192344 A1 | 8/2011 | Furukawa et al. | |

FOREIGN PATENT DOCUMENTS

| | | |
|---|---|---|
| JP | 2005-120412 A | 5/2005 |
| JP | 4377452 B1 | 9/2009 |
| WO | 2010/038272 A1 | 4/2010 |

OTHER PUBLICATIONS

Office Action issued in Japanese Patent Application No. 2010-156324, dated Feb. 4, 2014 (3 pages).

* cited by examiner

*Primary Examiner* — James Keenan
(74) *Attorney, Agent, or Firm* — Fitzpatrick, Cella, Harper & Scinto

(57) ABSTRACT

A substrate holder stocker device capable of reducing foot print is provided. The device includes: a movable table A which holds a plurality of substrate holders side by side in a plate thickness direction thereof and moves back and forth; a movable table B which is provided parallel to the movable table A and holds a plurality of the substrate holders side by side in a plate thickness direction thereof, and which moves back and forth; and an inter-table transfer mechanism for allowing the substrate holder which is held by one of the movable tables A and B stopped at predetermined positions to be held by the other of the movable tables A and B.

7 Claims, 18 Drawing Sheets

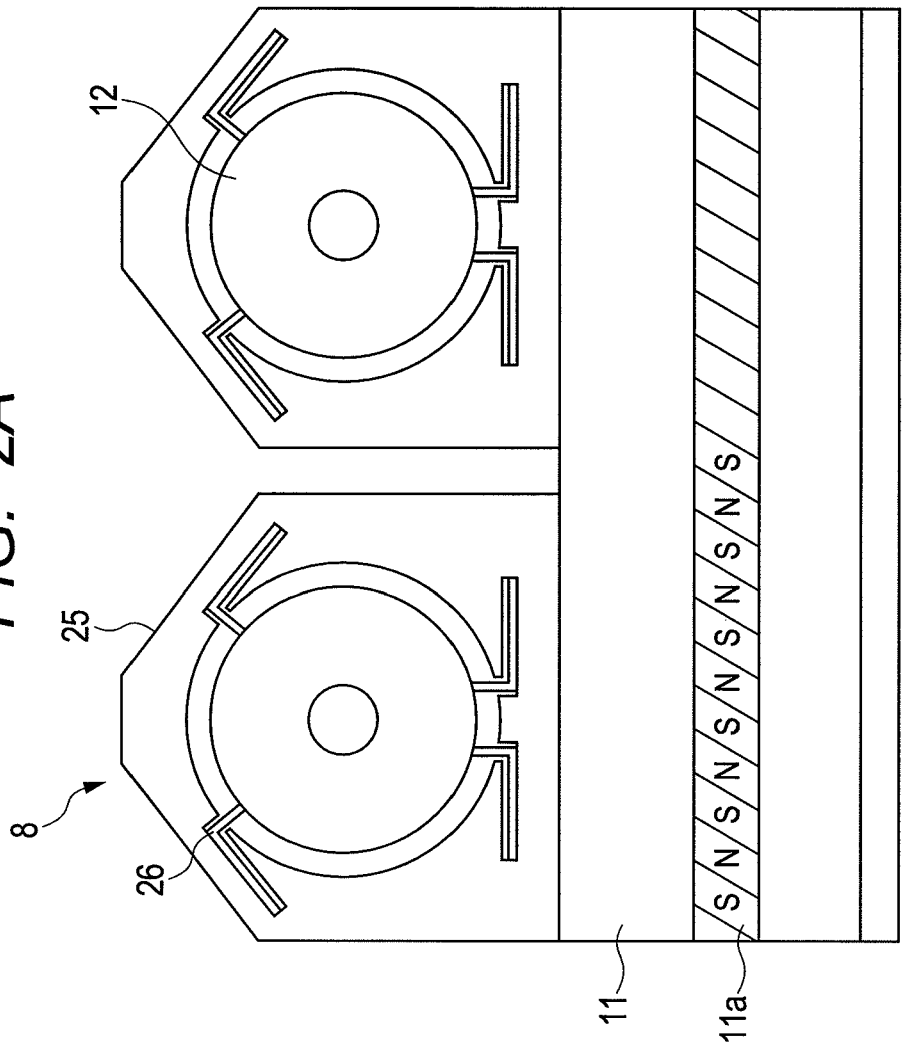
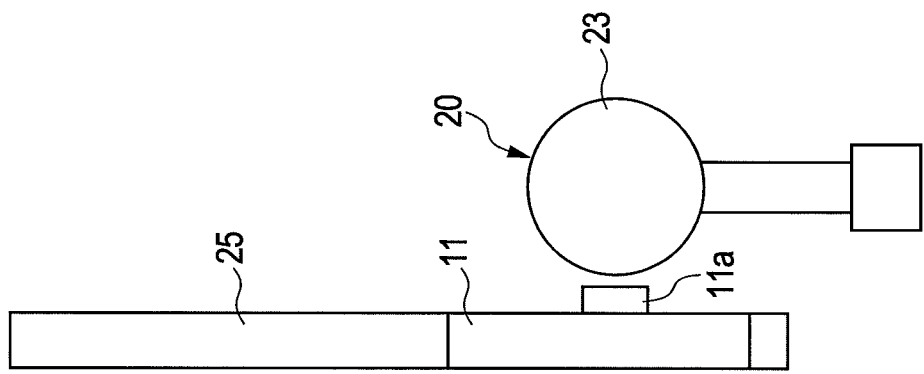

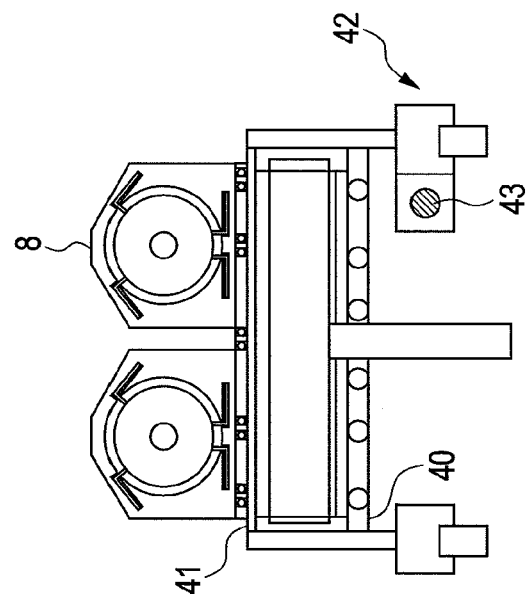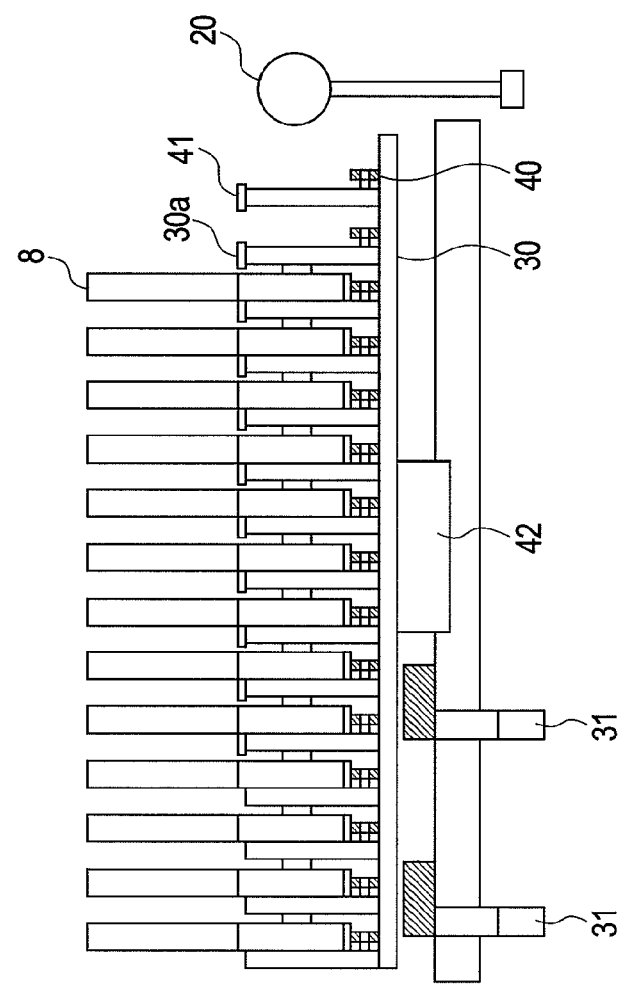

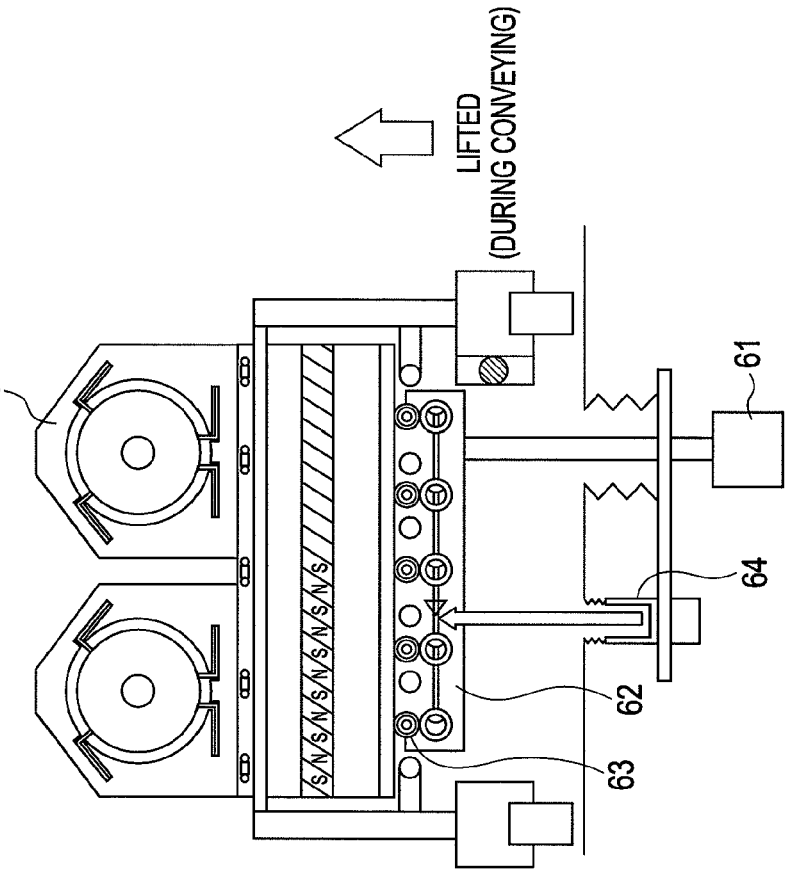
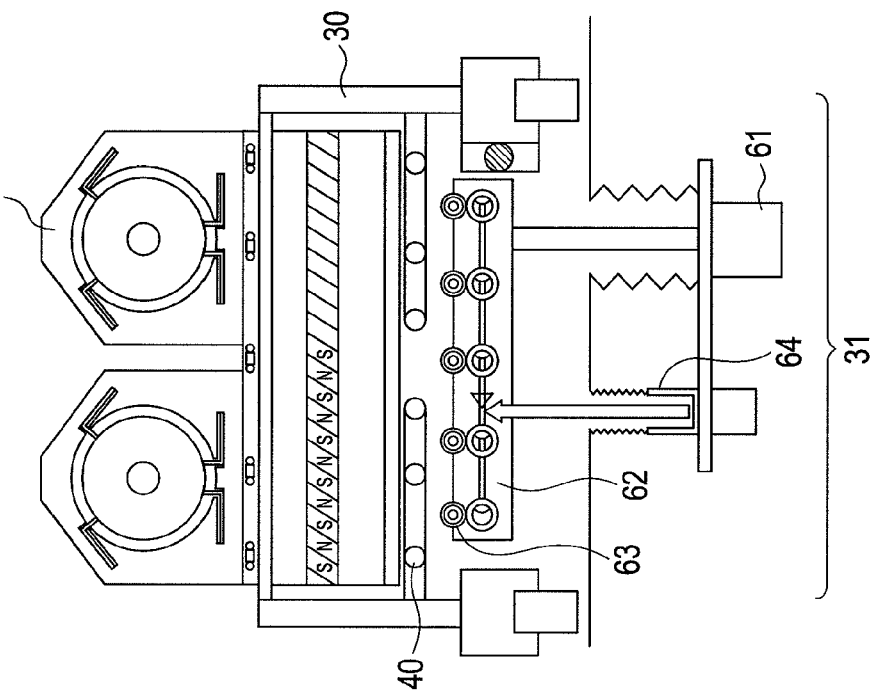

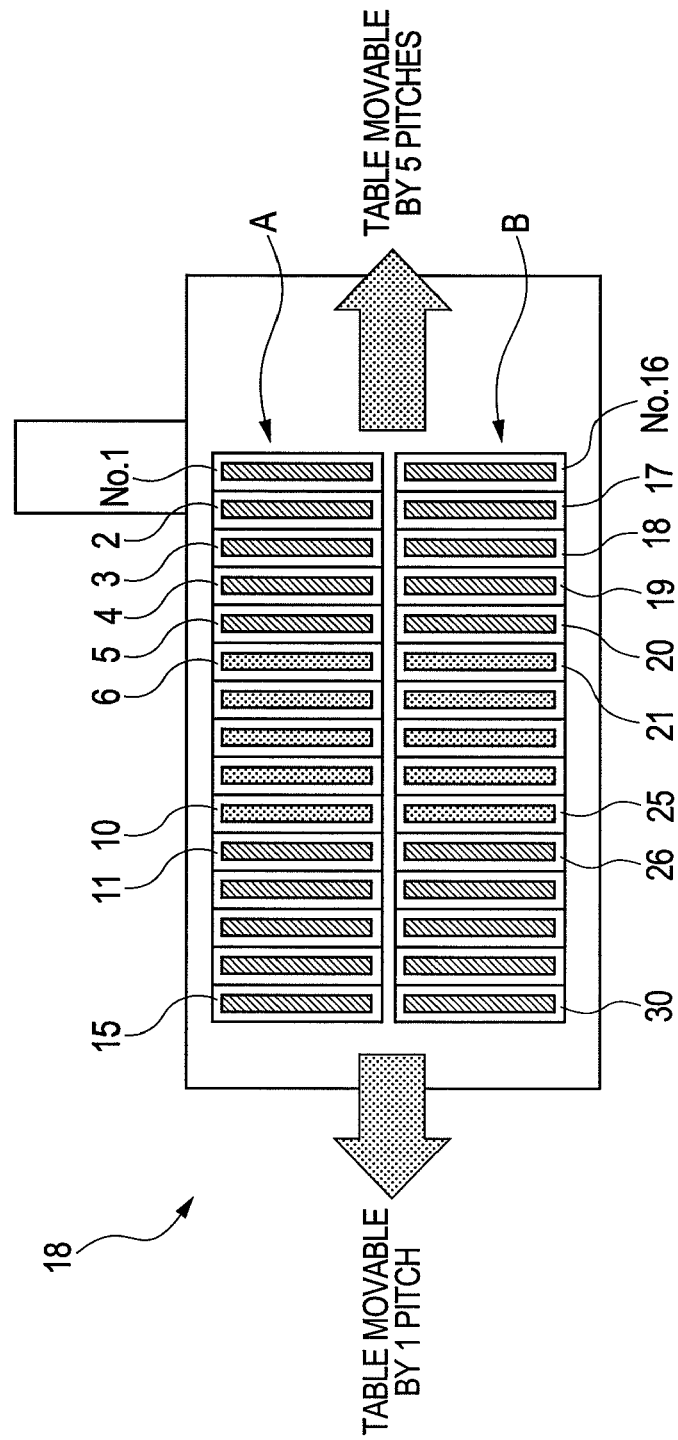

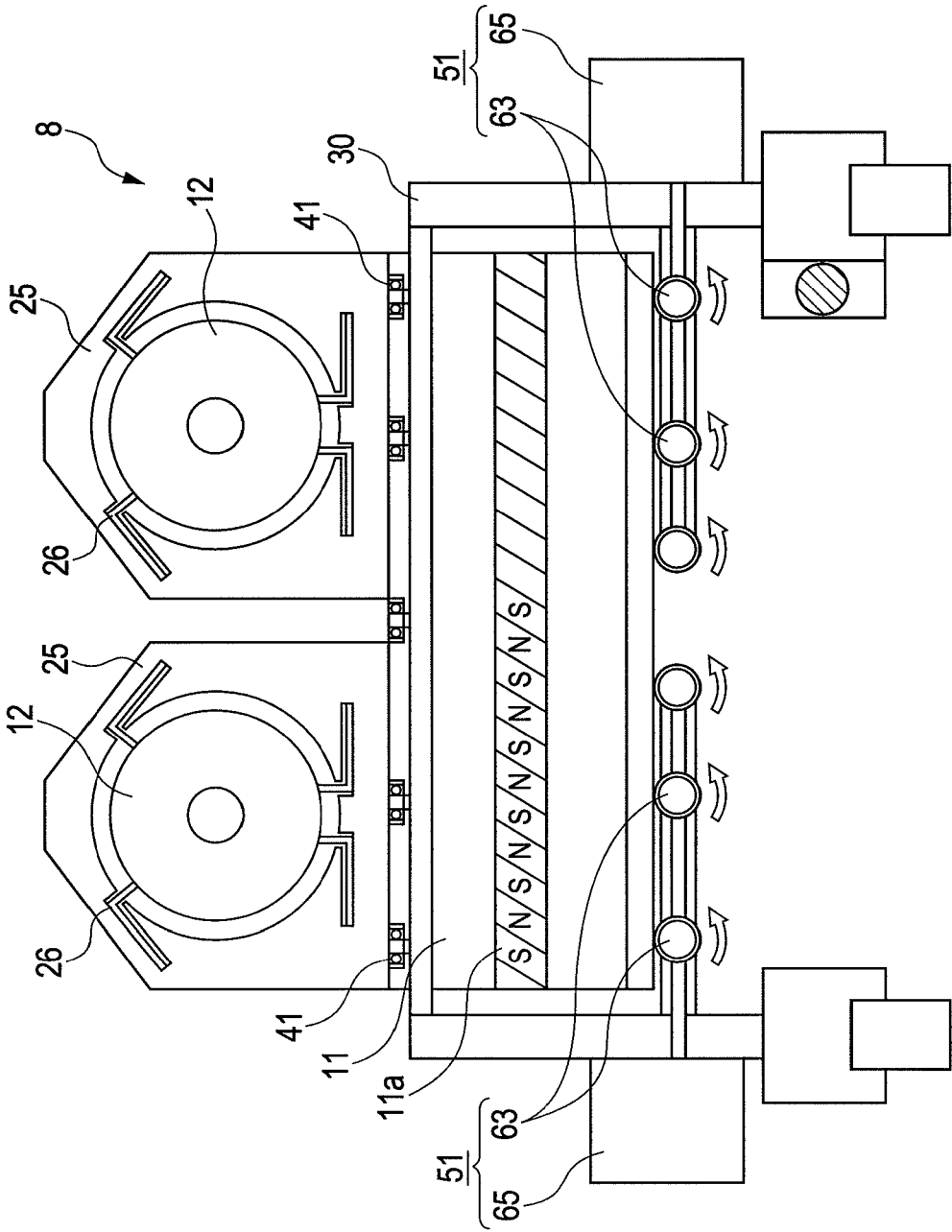

SUBSTRATE HOLDER STOCKER DEVICE, SUBSTRATE PROCESSING APPARATUS, AND SUBSTRATE HOLDER MOVING METHOD USING THE SUBSTRATE HOLDER STOCKER DEVICE

BACKGROUND OF THE INVENTION

1. Field of the Invention

The present invention relates to a substrate holder stocker device for storing a substrate holder in a vacuum processing apparatus which performs predetermined process on a surface of the substrate, a substrate processing apparatus, and a substrate holder moving method using the substrate holder stocker device.

2. Description of the Related Art

A system for replacing substrate holders using a substrate holder stocker chamber for coping with the film deposited on the substrate holder in the in-line type substrate processing apparatus has been known (Japanese Unexamined Patent Application Publication No. 2005-120412 and Japanese Patent No. 4377452). The substrate holder stocker chamber disclosed in Japanese Unexamined Patent Application Publication No. 2005-120412 includes a plurality of conveying rails provided with radially arranged conveying rollers, and a conveying rail rotating mechanism which is driven to rotate about the radiation center of the conveying rail as an axis so as to allow mounting of the substrate holders on the respective conveying rails. The system is configured such that the conveying rail is rotationally moved and connected to a carry-in/carry-out port (single location) formed in the stocker chamber, and thereby the substrate holder in the stocker chamber is loaded and collected into the in-line type substrate processing apparatus.

The substrate holder stocker chamber disclosed in Japanese Unexamined Patent Application Publication No. 2005-120412 which employs the rotating system for storing the substrate holders requires the conveying rails to be radially arranged. The radius of the radially arranged conveying rails is determined by the number of built-in rails and the rail interval. If the number of the built-in conveying rails is increased, the substrate holder has to be arranged apart from the radiation center, thus increasing the radius of the radial arrangement. The conveying rail interval around the center is increased as it is closer to the outer circumference in accordance with the radiation angle owing to the feature of the radial arrangement, thus generating useless space (dead space) in the outer circumference. The above-described disadvantage interferes with further reduction of the size of the substrate holder stocker chamber.

The substrate holder stocker chamber disclosed in Japanese Unexamined Patent Application Publication No. 2005-120412 has the storage substrate holders radially arranged. It is thus difficult to place the heater for heating all the substrate holders because of wide range of arranging the substrate holders. The heaters are then fixed to two positions on the ceiling, and substrate holders have to be rotated by the rotating mechanism for the purpose of ensuring temperature distribution upon heating. In the generally employed system, heat input level for each substrate holder is low, thus requiring long time and much power for degasifying heating including temperature rising.

The substrate holder stocker chamber disclosed in Japanese Patent No. 4377452 has the substrate holders arranged in parallel so that the dead space is reduced compared to the rotation type structure for storing the substrate holders, and furthermore, the device has simplified structure and reduced space. The substrate holders may be efficiently heated because of reduced size of the chamber.

However, the substrate holder stocker chamber disclosed in Japanese Patent No. 4377452 is configured to convey the stored substrate holders using the vertical moving mechanism. Therefore, upon movement of the substrate holder up and down, contact between metals or between metal and resin repeatedly occurs, which may generate dust accompanied with vertical movement of the substrate holder. Suppression of such dust generation has been demanded.

SUMMARY OF THE INVENTION

An object of the present invention is to provide a substrate holder stocker device capable of suppressing footprint, a substrate processing apparatus, and a substrate holder moving method using the substrate holder stocker device.

Other object of the present invention is to provide a substrate holder stocker device which generates less dust, the substrate processing apparatus, and the substrate holder moving method using the substrate holder stocker device.

A first aspect of the present invention is a substrate holder stocker device for storing a substrate holder, comprising: a chamber; a first movable holding unit which is provided in the chamber and configured to allow holding of a plurality of the substrate holders side by side in a first direction intersecting a direction of gravitational force, and which can move back and forth in the first direction; a second movable holding unit which is provided parallel to the first movable holding unit in the chamber and configured to allow holding of a plurality of the substrate holders side by side in the first direction, and which can move back and forth in the first direction; and a inter-table transfer unit, which is provided in the chamber and configured to move the substrate holder held at a predetermined holding position of one of the first and the second movable holding units in a direction different from the first direction, and to have the other of the first and the second movable holding units hold the substrate holder.

A second aspect of the present invention is a substrate processing apparatus, comprising: the substrate holder stocker device according to the first aspect of the present invention; a substrate transfer chamber for transferring a substrate to the substrate holder; and a process chamber for conveying the substrate mounted on the substrate holder and performing a vacuum processing.

A third aspect of the present invention is a substrate holder moving method in the substrate holder stocker device according to the first aspect of the present invention, wherein a holding position of the substrate holder in the first or the second movable holding unit is arbitrarily moved by alternately performing a reciprocating operation of at least one of the first and the second movable holding units in the first direction, and an operation of moving the substrate holder by the inter-table transfer unit.

The present invention is advantageous for simplified device structure and space saving. Reduction of the area for arranging the substrate holders may realize efficient heating. In embodiments of the present invention, during conveying, the substrate holders are brought into contact with all the bearings (rollers), thus suppressing dust generation caused by abrasion (contact).

BRIEF DESCRIPTION OF THE DRAWINGS

FIGS. 2A and 2B schematically illustrate a substrate holder used for the deposition device according to the embodiment of the present invention;

FIGS. 5A and 5B represent a structure of a movable table according to the embodiment of the present invention;

FIGS. 6A and 6B illustrate a structure of a substrate holder conveying mechanism according to the embodiment of the present invention;

FIG. 9 is an explanatory view of a conveying operation (sequence) of the substrate holder according to the embodiment of the present invention;

FIG. 18 schematically illustrates an inter-table transfer mechanism (inter-table transfer unit) according to the embodiment of the present invention.

DETAILED DESCRIPTION OF THE INVENTION

A substrate holder stocker chamber and a vacuum processing apparatus according to an embodiment of the present invention will be described hereinafter. A conveying control sequence for controlling positions of the substrate holders in the substrate holder stocker chamber will be described.

Figure 1:
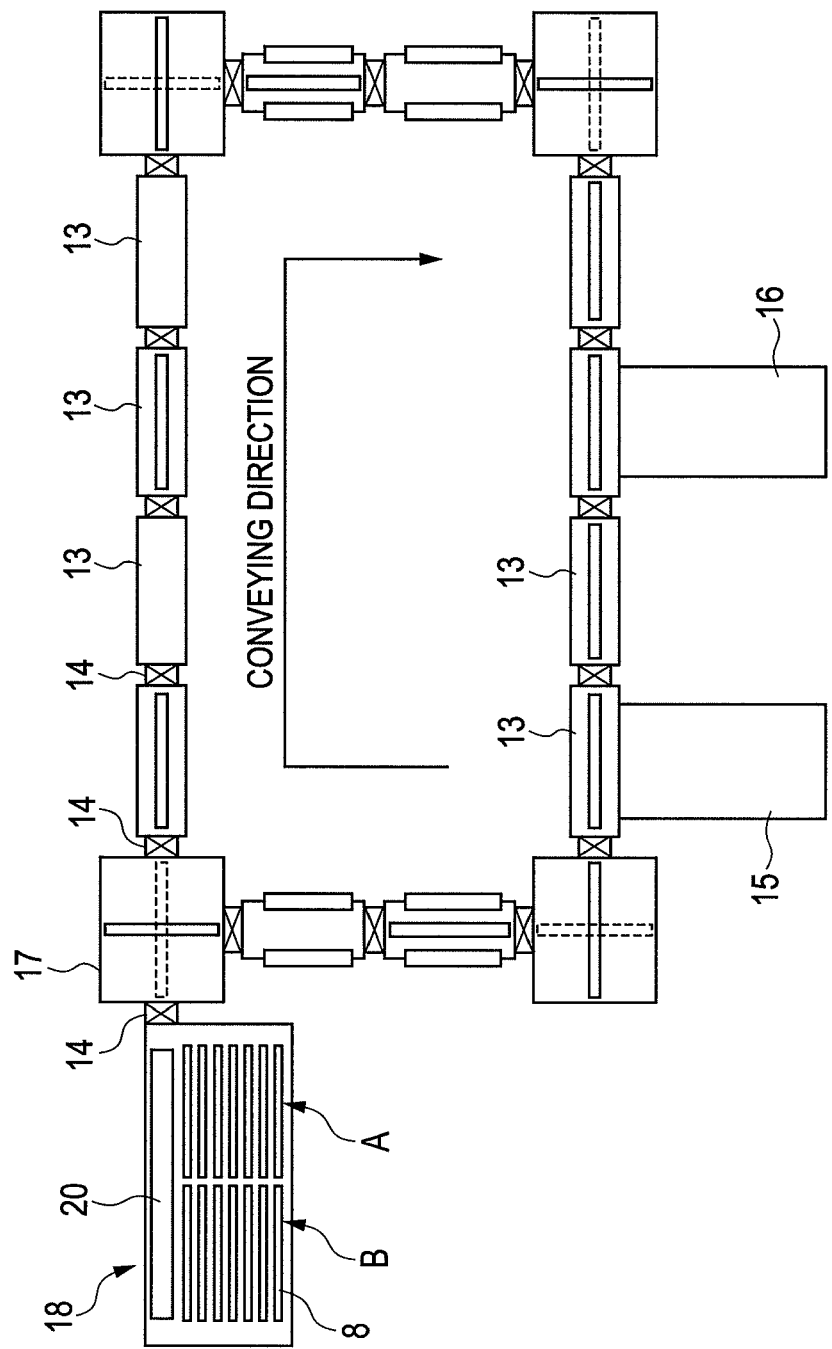
FIG. 1 schematically illustrates a configuration of a deposition device according to an embodiment of the present invention.

FIG. 1 is a plan view schematically illustrating configuration of a substrate processing apparatus (vacuum processing apparatus) of in-line type according to the embodiment. For example, the vacuum processing apparatus of this type may be used as the apparatus for manufacturing magnetic disks. The substrate processing apparatus according to the embodiment has a plurality of vacuum chambers 13 endlessly (forming a rectangular loop in FIG. 1) connected and arranged. Each of the vacuum chambers 13 is a vacuum vessel which discharges air via a dedicated or shared exhaust system. The boundary between the respective vacuum chambers 13 is provided with a gate valve 14, so that the respective vacuum chambers 13 are connected while being held in the air-tight state.

A substrate 12 held in a substrate holder 8 is conveyed in the substrate processing apparatus. A moving passage is formed inside the plurality of connected vacuum chambers 13. A magnet type conveying mechanism (to be described later) for moving the substrate holder 8 is provided along the moving passage. A substrate supply chamber 15 for mounting the substrate on the substrate holder 8, and a substrate discharge chamber 16 for collecting the substrate from the substrate holder 8 are connected to corresponding two vacuum chambers 13, respectively on one side of the rectangular arrangement among those forming the substrate processing apparatus. The substrate supply chamber 15 and the substrate discharge chamber 16 are referred to as a substrate transfer chamber collectively. Direction changing chambers 17 each provided with a direction changing mechanism are located at the respective four corners of the vacuum processing apparatus for changing the conveying direction of the substrate holder 8 at 90°. One of the direction changing chambers 17 is connected to a substrate holder stocker chamber 18 serving as a substrate holder stocker device via the gate valve 14.

FIGS. 2A and 2B schematically illustrate the substrate holder for conveying the substrate 12 to a predetermined position in the deposition chamber for film formation. FIGS. 2A and 2B are front and side views of the substrate holder, respectively. The substrate holder 8 includes a slider 11 having a mechanism for movement between the deposition chambers, and a holder 25 which is connected to the slider 11 and provided with a plurality of substrate support claws 26 for supporting the substrate 12. FIG. 2B shows an inter-device conveying mechanism 20 (inter-device conveying unit), and a conveying magnet 23.

The substrate holder 8 according to the embodiment is configured to hold one or more substrates 12 (FIG. 2A shows two substrates) so as to have both surfaces simultaneously processed in the vacuum chamber 13. The mechanical unit of the slider 11 is provided with a magnet (permanent magnet) 11a which extends in a direction parallel to the substrate surface. The substrate holder 8 is magnetically coupled with magnetism of the conveying mechanism to be described later, and conveyed along the extending direction of the magnet 11a.

Figure 3:
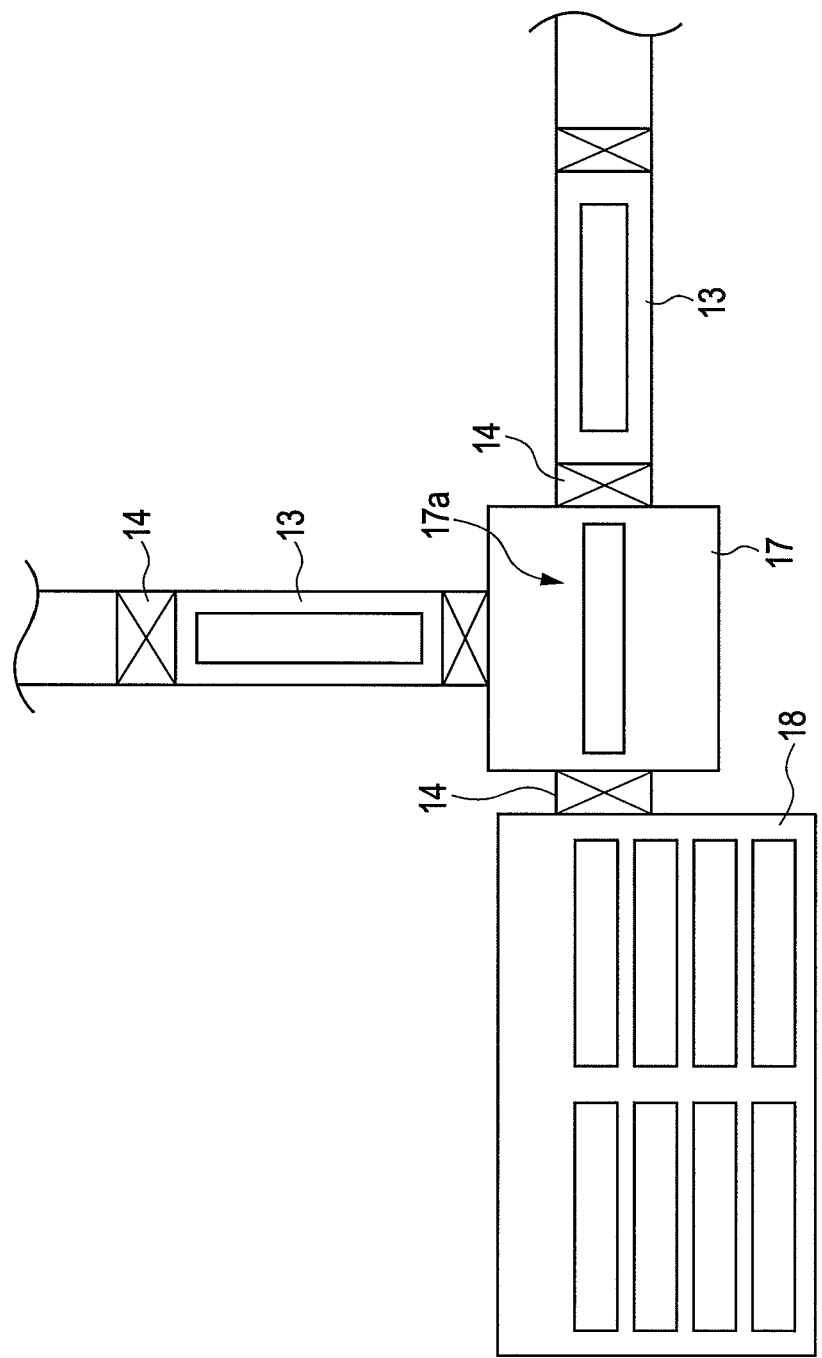
FIG. 3 represents connection of the deposition device to a substrate holder stocker chamber according to the embodiment of the present invention.

FIG. 3 represents connection of the substrate holder stocker chamber 18 to the deposition device. The substrate holder stocker chamber 18 stores new and reproduced/cleaned substrate holders 8, and accommodates the substrate holder 8 on which the film is deposited, which has been collected from the substrate processing apparatus for replacement. The chamber stores the substrate holder equipped with a vacuum vibration sensor (acceleration sensor) so as to be loaded in the deposition device upon the conveying failure, which may be subjected to appropriate inspection and measurement.

As described above, the substrate holder stocker chamber 18 is connected to the direction changing chamber 17 via the gate valve 14. The substrate holder 8 stored in the substrate holder stocker chamber 18 can be fed into the deposition device via the direction changing chamber 17, or the used substrate holder 8 can be collected in the substrate holder stocker chamber 18.

A conveying unit 17a in the direction changing chamber 17 is a mechanism capable of rotating the direction of the substrate holder 8. In case of normal conveying in the deposition device, the conveying unit 17a changes direction of the substrate holder 8 which has been conveyed from the vacuum chamber 13 at upstream side for the previous process so as to be connected to the moving passage connected to the vacuum chamber 13 at downstream side for the subsequent process.

After conveying the substrate holder 8 from the substrate holder stocker chamber 18 to the direction changing chamber 17, direction of the substrate holder 8 is changed by the conveying unit 17a in the direction changing chamber 17 to be conveyed to the vacuum chamber 13 at downstream side, so that the substrate holder 8 is carried out from the substrate holder stocker chamber 18. When the substrate holder 8 is collected, The substrate holder 8 which has been conveyed from the vacuum chamber 13 at upstream side is directly collected in the substrate holder stocker chamber 18 without operating the direction changing chamber 17 to change the direction. This makes it possible to replace the substrate holders 8 without interrupting the production.

Figure 4A:
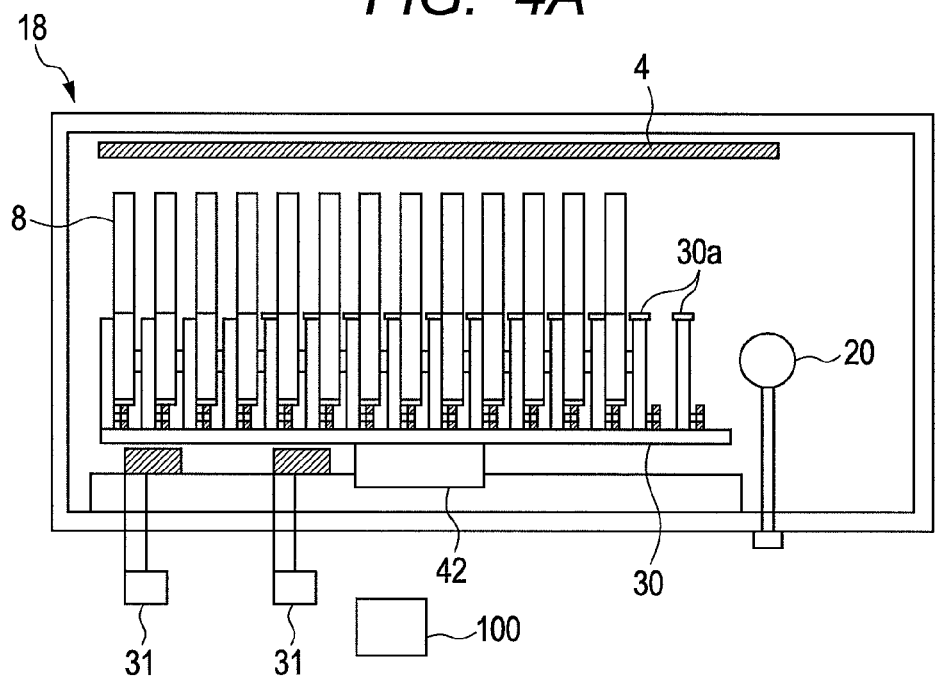
FIGS. 4A to 4C represent an inner structure of the substrate holder stocker chamber according to the embodiment of the present invention.
Figure 4B:
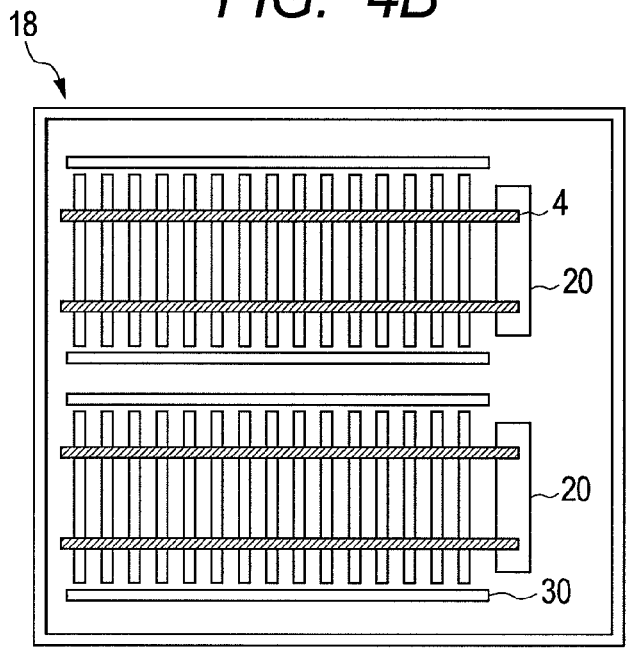
Figure 4C:
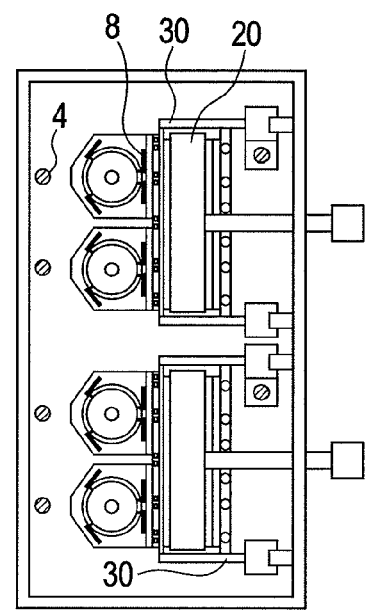

Referring to FIGS. 4A to 8B, structure of the substrate holder stocker chamber 18 will be described. FIGS. 4A to 4C schematically illustrate the substrate holder stocker chamber 18. FIG. 4A is a side view (sectional view), FIG. 4B is a layout view seen from above, and FIG. 4C is a sectional view seen from front. FIGS. 5A and 5B show a movable table 30 for storing the substrate holders. FIGS. 5A and 5B are side and front views of the movable table, respectively.

The substrate holder stocker chamber 18 includes two movable tables 30 (first and second movable holding units) for holding a plurality of the substrate holders 8, and inter-table transfer mechanisms 31 each as an inter-table transfer unit for conveying the substrate holder 8 between the two movable tables 30 in the vacuum vessel (chamber). The substrate holder stocker chamber 18 includes an inter-device conveying mechanism 20 serving as an inter-device conveying unit for conveying the substrate holders 8 between the direction changing chamber 17 and the movable table 30, and a heater 4 (heating unit 32) serving as a heater for heating the substrate holder 8. Combination of the plurality of movable tables 30 and the inter-table transfer mechanisms 31 will be collectively referred to as a movable table mechanism.

Two movable tables 30 each as a member for holding the substrate holder 8 while being aligned in the plate thickness direction are provided in the substrate holder stocker chamber 18. As the movable table 30 is configured to hold the substrate holder 8 while being let stand, the plate thickness direction of the substrate holder 8 is the first direction which intersects the direction of gravitational force. Table rails 30a (rails) each capable of holding the single substrate holder 8 are provided on the upper surface of the movable table 30 in parallel with one another. The substrate holder stocker chamber 18 according to the embodiment includes two movable tables 30. However, three or more movable tables may be employed, and the arbitrary number of the table rails 30a may be provided as well.

The table rail 30a is a frame-like member which supports the substrate holder 8 held on the movable table 30 so as not to fall over or roll down, and provided with a guide roller 40 for supporting the substrate holder 8 at the lower side and a guide roller 41 for laterally supporting the substrate holder 8 to execute a position control. The guide rollers 40 and 41 serve to guide the substrate holder 8 which is moved between the two movable tables 30, 30.

The movable table 30 is provided with a drive mechanism 42 for displacing the movable table 30 in a holder alignment direction (first direction). The drive mechanism 42 horizontally moves the movable table 30 back and forth (holder alignment direction). The drive mechanism 42 according to the embodiment is an actuator which includes a ball screw 43 connected to the drive source and a nut member connected to the lower section of the movable table 30. The nut member is screwed with the ball screw 43 which extends in the longitudinal direction of the movable table 30.

The ball screw 43 is driven by the drive source (motor) to rotate under the control of a controller 100. The nut member is moved back and forth (holder alignment direction) by rotation of the ball screw 43, so that the movable table 30 connected to the nut member is moved back and forth. An arbitrary actuator as the drive mechanism 42 may be employed without being limited to the ball screw 43, for example, the cylinder mechanism such as air cylinder and hydraulic cylinder, and magnet actuator for driving through magnetic coupling likewise the conveying mechanism 20 to be described below so long as the movable table 30 may be moved back and forth.

In the embodiment, the controller 100 is formed as the computer, which is capable of controlling operations of the movable table 30, inter-table transfer mechanism 31, and the inter-device conveying mechanism 20 in accordance with the program stored in the memory of the controller 100.

FIGS. 6A and 6B schematically show the inter-table transfer mechanism 31 (inter-table transfer unit). The inter-table transfer mechanism 31 is provided at a predetermined position at the lower portion of the movable table 30, and includes a vertical moving mechanism 61 and a roller rotating mechanism (frictional conveying mechanism) 62. FIGS. 4A to 5B show two inter-table transfer mechanisms 31. However, three or more inter-table transfer mechanisms 31 may be employed.

The inter-table transfer mechanism 31 (frictional conveying mechanism 62) is kept standby at the lower position when moving the movable table 30 back and forth by the drive mechanism 42 (see FIG. 6A). Specifically, the controller 100 drives the vertical moving mechanism 61 to move the inter-table transfer mechanism 31 to the position apart from the lower surface of the substrate holder 8. In this case, the substrate holder 8 on the movable table 30 is held on the guide roller 40 of the table rail 30a.

When conveying the substrate holder 8 between the two movable tables 30, the frictional conveying mechanism 62 is lifted while keeping the table rail 30a which stores the substrate holder 8 to be conveyed at the specified position (directly above the frictional conveying mechanism 62) (see FIG. 6B). Specifically, the controller 100 drives the vertical moving mechanism 61 to move the inter-table transfer mechanism 31 so that the conveying roller 63 is brought into contact with the lower surface of the substrate holder 8. The substrate holder 8 on the movable table 30 is lifted by the conveying roller 63 (propulsion unit) of the frictional conveying mechanism to the slightly higher level. Thereafter, the frictional conveying is performed through rotation of the conveying roller 63. The conveying roller 63 is rotated while having the substrate holder 8 lifted thereby, so that the substrate holder 8 is conveyed between the two movable tables 30.

The vertical moving mechanism 61 for vertically moving the inter-table transfer mechanism 31 is configured by connecting an air cylinder and an in-vacuum mechanism using the shaft. However, arbitrary mechanism may be employed so long as the inter-table transfer mechanism 31 is vertically moved (direction of gravitational force). The conveying roller 63 is simultaneously rotated by gear engagement. The conveying rollers 63 are provided at a pitch (position) so as not to cause interference between the guide rollers 40 (see FIG. 5)

provided on the movable table 30. They are capable of moving up without being in contact with the guide roller 40.

In the embodiment, the conveying roller 63 is driven (by the controller 100) through rotation of the motor and engagement of gear. A magnetic rotation introducing unit 64 serves to introduce drive into the vacuum chamber from atmosphere. A rotation introducing unit using the magnetic fluid may be employed as well. The conveying not only of the roller friction type but also the magnetic type (magnetic screw type, linear motor type) may be employed.

Figure 7:
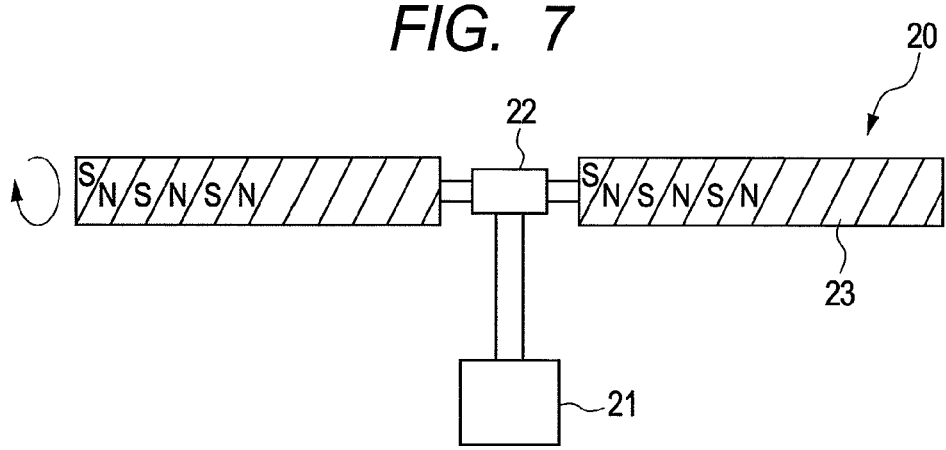
FIG. 7 illustrates a structure of an inter-device conveying mechanism according to the embodiment of the present invention.

FIG. 7 schematically illustrates the inter-device conveying mechanism 20 as the inter-device conveying unit. The inter-device conveying mechanism 20 uses magnetism for conveying the substrate holder 8 between a predetermined position of the movable table 30 and the direction changing chamber 17.

The inter-device conveying mechanism 20 (inter-device conveying unit) has the conveying magnet (permanent magnet) 23, a drive source 21 for generating rotating drive force such as the motor, and a rotating direction converting mechanism 22 for converting the rotation of the drive source 21 into the rotation around the axis of the conveying magnet 23, as main components. The conveying magnet 23 is a so called magnetic screw having magnetic poles such as N-pole and S-pole spirally formed on the surface of the axial member longitudinally arranged in the moving direction of the substrate holder. Rotation of the conveying magnet 23 around the axis allows the substrate holder 8 magnetically coupled via the permanent magnet 11a to be conveyed in the direction along the axis.

The inter-device conveying mechanism 20 according to the embodiment is fixed to the conveying line to the direction changing chamber 17, and performs magnetic conveying for position control by bringing the substrate holder 8 close to the conveying magnet 23 by the movable table 30. In the embodiment, the conveying mechanism may be in the form not only of the magnetic coupling but also of linear conveying drive type.

The table rail 30a has a frame-like shape as a front view, and allows the conveying magnet 23 to pass through the inside. This makes it possible to convey the substrate holder 8 which is arranged on the table rail 30a other than the one at the rightmost side shown in FIGS. 4A and 4B. That is, the inter-device conveying mechanism 20 serves to convey the substrate holder 8 which is the closest to the conveying magnet (permanent magnet) 23 among those held on the movable table 30.

Figure 8A:
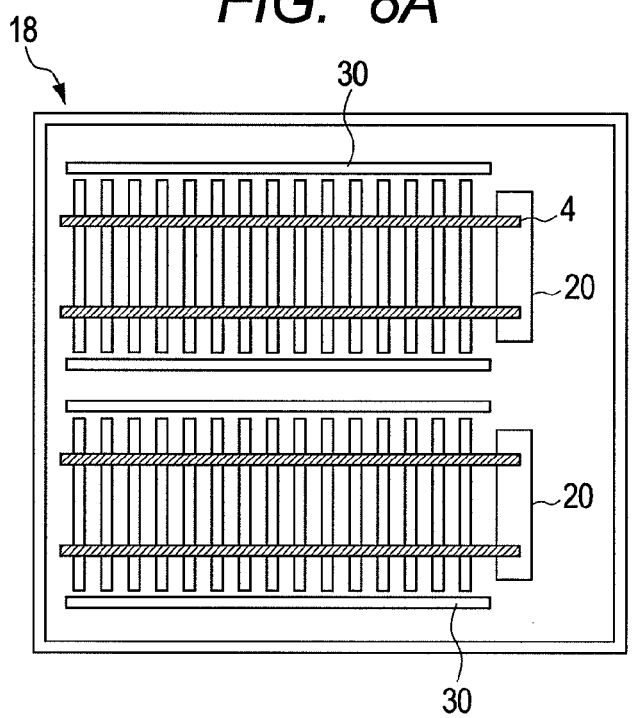
FIGS. 8A and 8B represent a layout of a heater in the substrate holder stocker chamber according to the embodiment of the present invention.
Figure 8B:
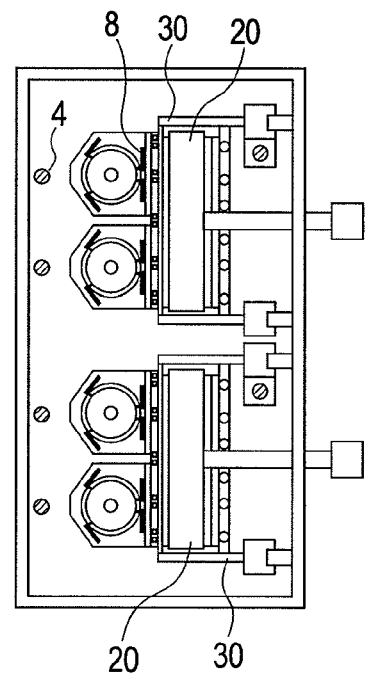

FIGS. 8A and 8B show arrangement of heaters in the substrate holder stocker chamber. FIG. 8A shows an arrangement seen from above, and FIG. 8B is a sectional view seen from front. The heater 4 is a heat generator for heating the substrate holder 8 so as to perform degasifying, which is provided above the substrate holder 8 so as not to be brought into contact with each other when the substrate holder 8 is positioned at the upper side.

As the heater 4, a lamp heater capable of heating the substrate holder 8 using radiation heat, and a sheath heater for heating the substrate holder 8 via heating of gas. The higher heating effect may be obtained by bringing the substrate holder 8 to be closer to the heater 4 using a holder vertical moving mechanism (not shown) for lifting the substrate holder 8. As the holder vertical moving mechanism, the one for vertically moving the movable table 30 or vertically moving only the substrate holder 8 may be employed.

The substrate holder 8 may be heated by introducing high temperature gas instead of or together with the heater 4. Heating may be performed in the pressure state of the chamber, for example, the pressurizing state, atmospheric state, and vacuum state.

The operation for conveying the substrate holder 8 in the substrate holder stocker chamber 18 will be described based on FIGS. 9 to 13F. The substrate holder stocker chamber 18 shown in FIG. 9 includes two movable tables 30 (hereinafter referred to as movable tables A and B) each capable of storing 15 substrate holders, respectively. Those two movable tables A and B correspond to first and second movable holding units, respectively.

The movable table A includes Nos. 1 to 15 table rails 30a, and the movable table B includes Nos. 16 to 30 table rails 30a. Each of the table rails 30a is capable of holding the single substrate holder 8. The drive mechanism 42 can move each of the movable tables A and B by a distance corresponding to the length six times the length of the table rail 30a (six times the length of the table rail 30a in the short axis direction). Specifically, each of the movable tables A and B is allowed to move in the range from five pitches (five times the length of the table rail 30a) forward to one pitch (length of the table rail 30a) backward as shown in FIG. 9.

The inter-table transfer mechanisms 31 (31a, 31b) for conveying the substrate holder 8 between the movable tables A and B are provided at two locations, and the inter-device conveying mechanism 20 for conveying the substrate holder 8 with respect to the direction changing chamber 17 is provided at one location, which are not shown in FIG. 9. More specifically, referring to FIG. 9, the inter-table transfer mechanisms 31 are provided below the positions No. 6 and No. 11 of the table A, and the inter-device conveying mechanism 20 is provided to transfer the substrate holder 8 held at the position of No. 1. Although FIG. 9 shows the state where the substrate holder 8 is held on each of the table rail 30a, for the purpose of simplifying the explanation, several the substrate holders 8 are differently colored. That is, color of the substrate holders 8 held at the positions No. 6 to 10 of the table A and at the positions 21 to 25 of the table B in the drawing is changed to be different from that of the substrate holders 8 held by the other table rails 30a. This color classification applies to FIGS. 11A to 16B.

Figure 10A:
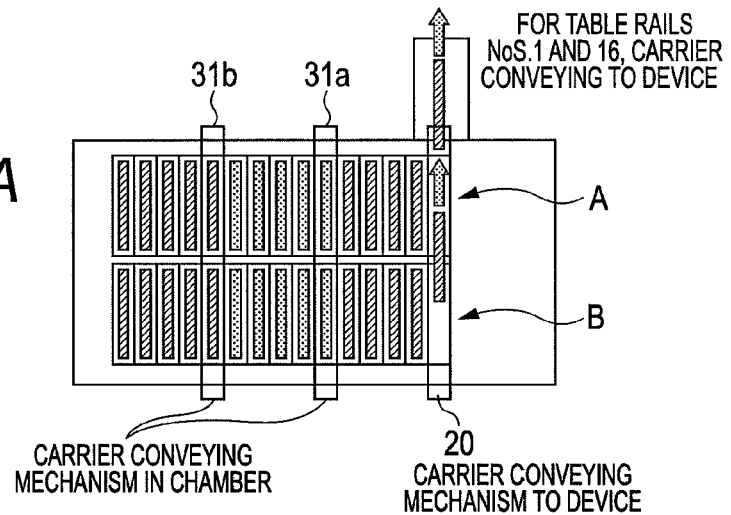
FIGS. 10A to 10C are explanatory views of conveying operations (sequence) of the substrate holders according to the embodiment of the present invention.
Figure 10B:
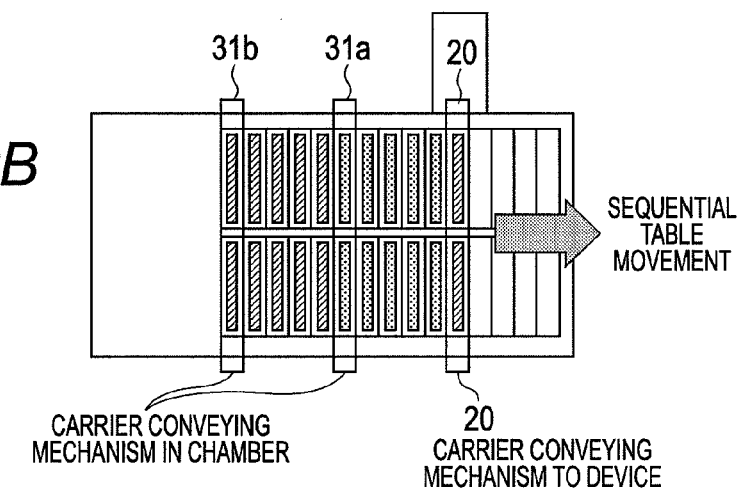
Figure 10C:
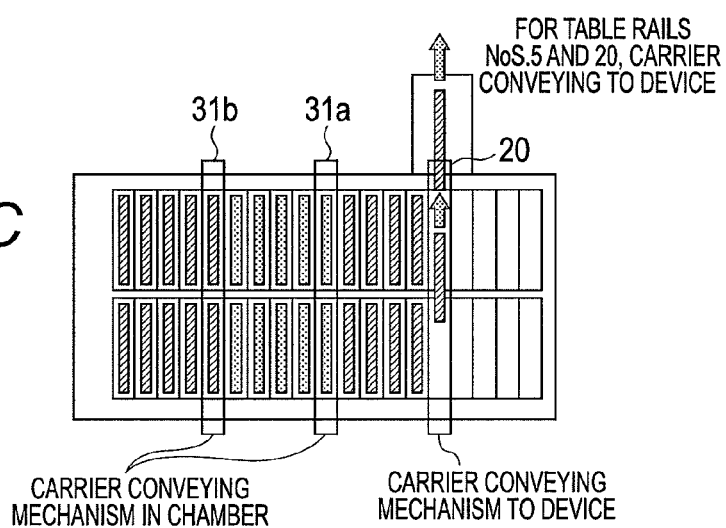

Referring to FIGS. 10A to 10C, operations for conveying the substrate holders 8 stored in the respective table rails Nos. 1 to 5, and 16 to 20 to the deposition device (direction changing chamber 17) will be described. Specifically, the controller 100 controls the drive mechanism 42 to move the table rails to the position where the substrate holder 8 desired to be conveyed is close to the conveying magnet 23 of the inter-device conveying mechanism 20. The controller 100 further controls the drive source 21 to rotate the conveying magnet 23, so that they are sequentially conveyed to the direction changing chamber 17. Each of the movable tables A and B has the movable range up to forward by the amount corresponding to five pitches, and 10 substrate holders as described above may be moved to the position adjacent to the conveying magnet 23 only by sliding the movable tables A and B in the longitudinal direction. In this embodiment, the substrate holder 8 is in contact with the table rail 30a via the guide rollers 40 and 41. When conveying the substrate holder 8 by rotating the conveying magnet 23, the guide rollers 40 and 41 are rotated together as well. This makes it possible to smoothly move the substrate holder 8 with respect to the guide rollers 40 and 41, thus reducing dust generated upon the conveying of the substrate holder.

Referring to FIGS. 11A to 11D, and 12A to 12D, operations for conveying the substrate holders respectively stored in the table rails Nos. 6 to 10 and Nos. 21 to 25 to the deposition device will be described. The table rails Nos. 6 to 10 and Nos. 21 to 25 are at the locations in the movable ranges of the movable tables A and B where the inter-device conveying mechanism 20 does not exist. In other words, only the operation of the movable tables A and B by the drive mechanism 42 does not allow the table rails Nos. 6 to 10 and Nos. 21 to 25 to move to the position to which the transfer by the inter-device conveying mechanism 20 can be performed.

So first of all, the inter-table transfer mechanism 31 is used to change positions of the substrate holders 8 held on the movable tables A and B. For example, position of the substrate holder 8 held by the table rail No. 6 may be changed by performing the following operations. The controller 100 controls the drive mechanism 42 of the movable table A to move the table rail No. 6 on the movable table A above the inter-table transfer mechanism 31 (31*a*). Likewise, the controller 100 controls the drive mechanism 42 of the movable table B to move the table rail No. 20 (empty) on the movable table B above the inter-table transfer mechanism 31 (31*a*) (see FIG. 11A). Thus, the movable tables A and B are stopped at the predetermined positions. The controller 100 controls the vertical moving mechanism 61 of the inter-table transfer mechanism 31 (31*a*) facing the movable table A to lift the inter-table transfer mechanism 31 (31*a*), so that the substrate holder 8 held by the table rail No. 6 contacts the conveying roller 63. Likewise, the controller 100 controls the vertical moving mechanism 61 of the inter-table transfer mechanism 31 (31*a*) facing the movable table B to lift the inter-table transfer mechanism 31 (31*a*). Then, the controller 100 operates the magnetic rotation introducing units 64 of the inter-table transfer mechanisms 31 (31*a*) facing the movable tables A and B, respectively. Thereby, the conveying roller 63 of the inter-table transfer mechanism 31 (31*a*) facing the movable table A is rotated, and the conveying roller 63 of the inter-table transfer mechanism (31*a*) facing the movable table B is rotated in conjunction with the rotation. This allows the table rail No. 6 on the movable table A to convey the substrate holder to the table rail No. 20 on the movable table B (see FIG. 11B).

In this embodiment, the substrate holder 8 provided on the table rail No. 6 may be conveyed to the table rail No. 20 while bringing the conveying roller 63 in contact with the guide roller 41. This makes it possible to move the substrate holder 8 smoothly with respect to the conveying roller 63 and the guide roller 41, thus reducing dust generated upon the conveying of the substrate holder.

Figure 11A:
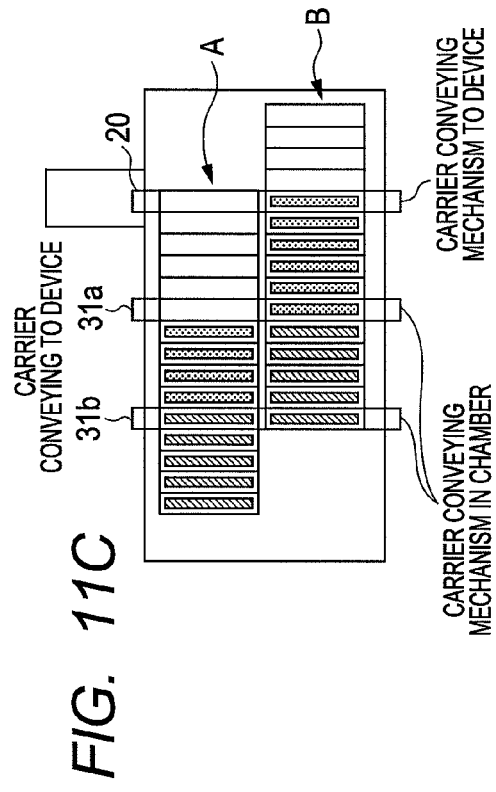
FIGS. 11A to 11D are explanatory views of conveying operations (sequence) of the substrate holders according to the embodiment of the present invention.
Figure 11C:
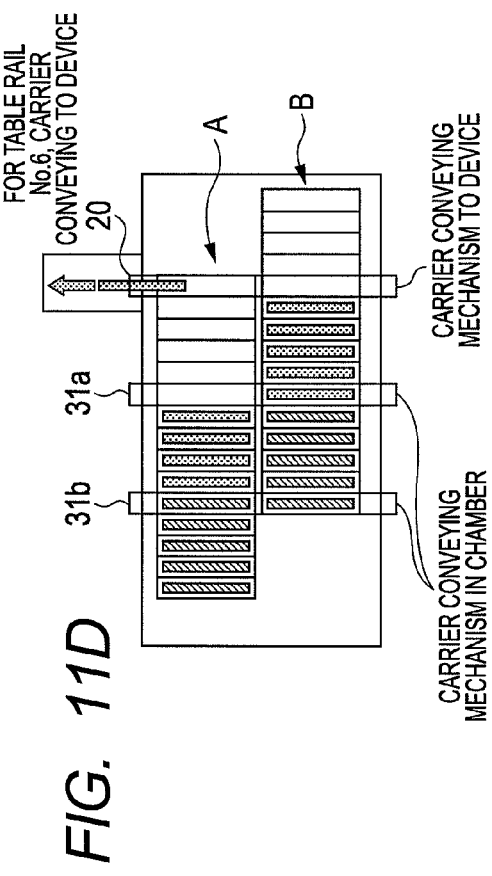
Figure 11B:
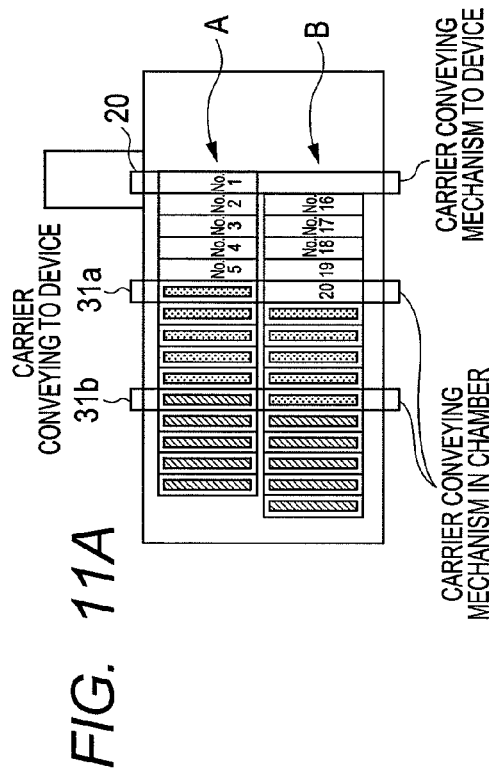
Figure 11D:
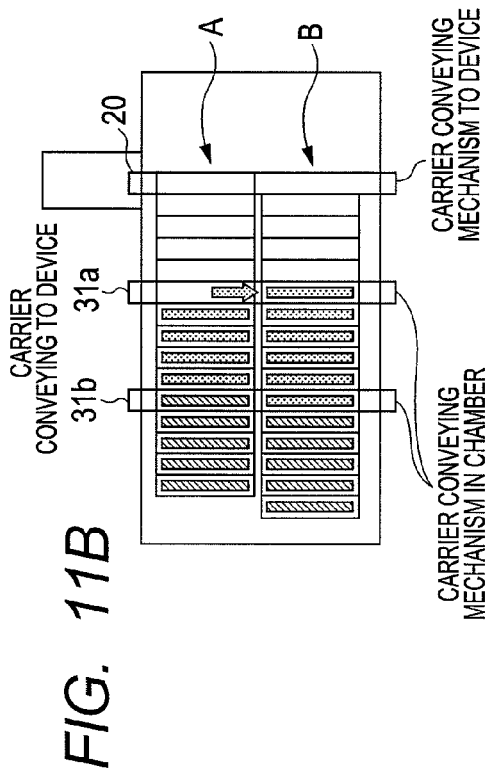

Then, the substrate holder conveyed (having its position changed) to the table rail No. 20 by the drive mechanism 42 can be moved to the position to which the inter-device conveying mechanism 20 is allowed to transfer to be carried out to the deposition device (see FIGS. 11C and 11D).

Figure 12A:
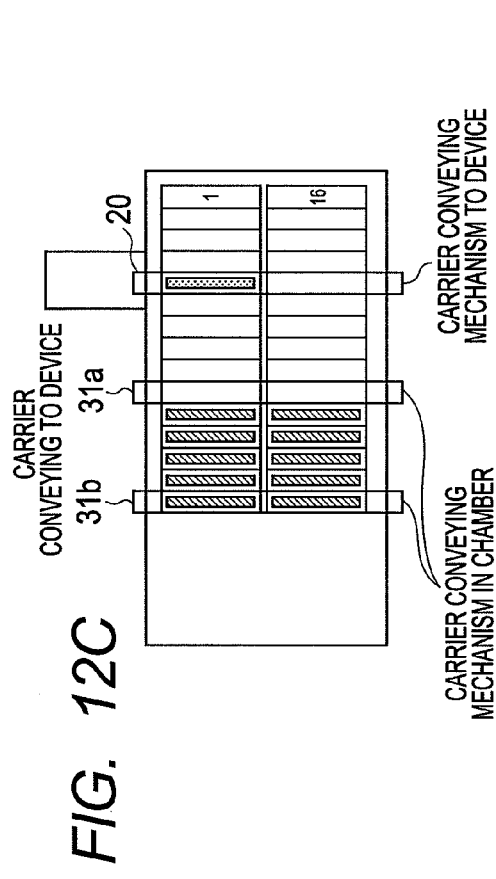
FIGS. 12A to 12D are explanatory views of conveying operations (sequence) of the substrate holders according to the embodiment of the present invention.
Figure 12B:
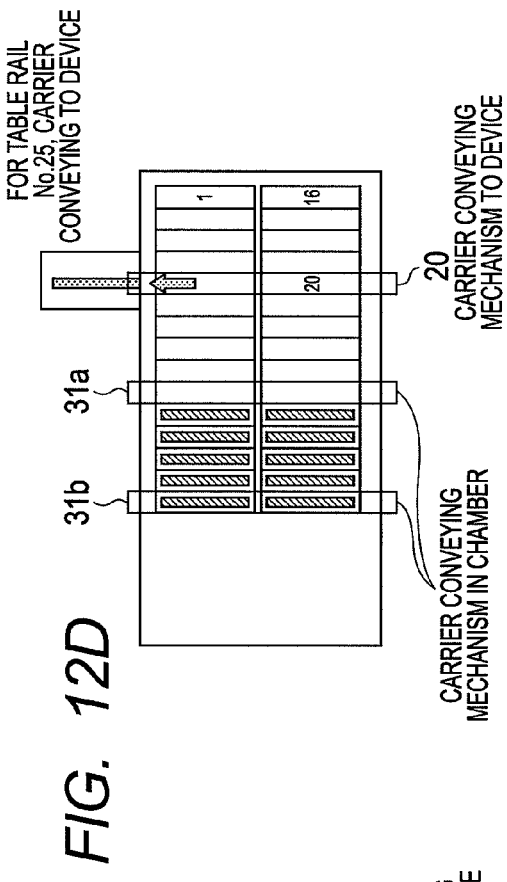
Figure 12C:
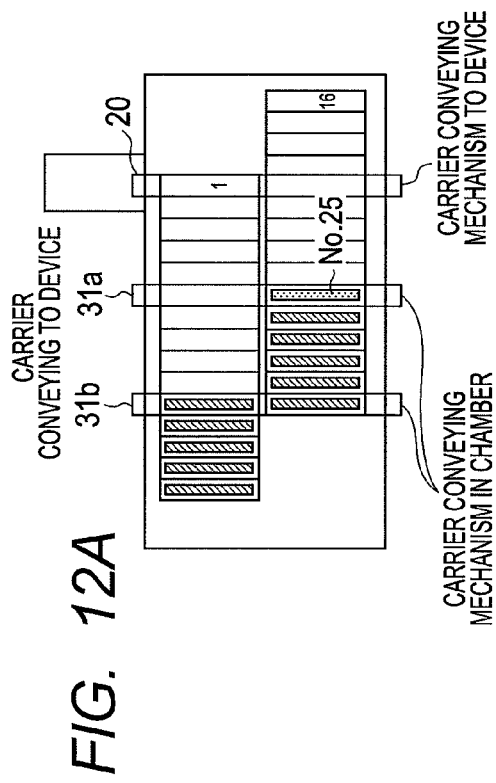
Figure 12D:
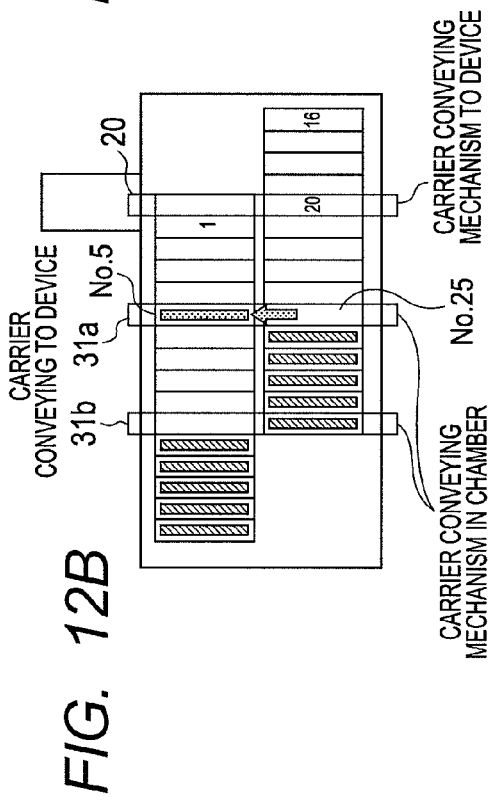

Likewise, the table rail No. 25 on the movable table B is conveyed to the table rail No. 5 on the movable table A by the inter-table transfer mechanism 31 (31*a*) (see FIGS. 12A and 12B). The table rail No. 5 on the movable table A is moved to the position to which the inter-device conveying mechanism 20 is allowed to transfer to be carried out to the deposition device (see FIGS. 12C and 12D).

Referring to FIGS. 13A to 13F, operations for conveying the substrate holders stored in the table rails Nos. 11 to 15 and Nos. 26 to 30 to the deposition device will be described. The table rails Nos. 11 to 15 and Nos. 26 to 30 are at the locations in the movable ranges (five pitches) of the movable tables A and B where the inter-device conveying mechanism 20 does not exist. In other words, movable tables A and B operated only by the drive mechanism 42 fail to move the table rails Nos. 11 to 15 and Nos. 26 to 30 to the position to which the inter-device conveying mechanism 20 is allowed to transfer.

So, first of all, the conveying is repeatedly performed a plurality of times using the inter-table transfer mechanisms 31*a* and 31*b* to change positions of the substrate holders 8 held on the movable tables A and B.

Figure 13A:
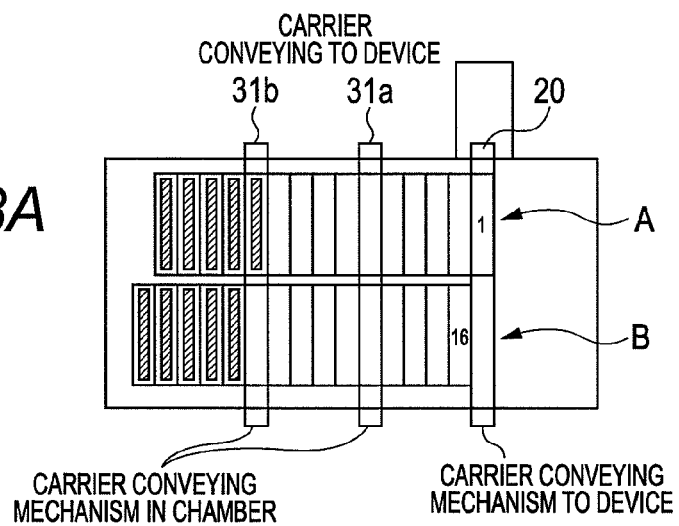
FIGS. 13A to 13F are explanatory views of conveying operations (sequence) of the substrate holders according to the embodiment of the present invention.
Figure 13B:
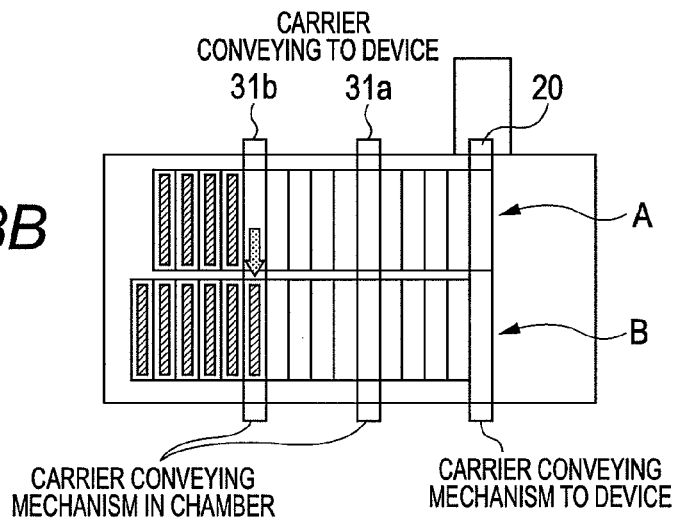

For example, when the position of the substrate holder 8 on the table rail No. 11 is changed, the table rail No. 11 on the movable table A is moved to the position above the inter-table transfer mechanism 31*b*, and the table rail No. 25 (empty) on the movable table B is moved to the position above the inter-table transfer mechanism 31*b* (see FIG. 13A). Then, the inter-table transfer mechanism 31*b* is lifted, so that the substrate holder 8 is conveyed from the table rail No. 11 on the movable table A to the table rail No. 25 on the movable table B (see FIG. 13B).

Figure 13C:
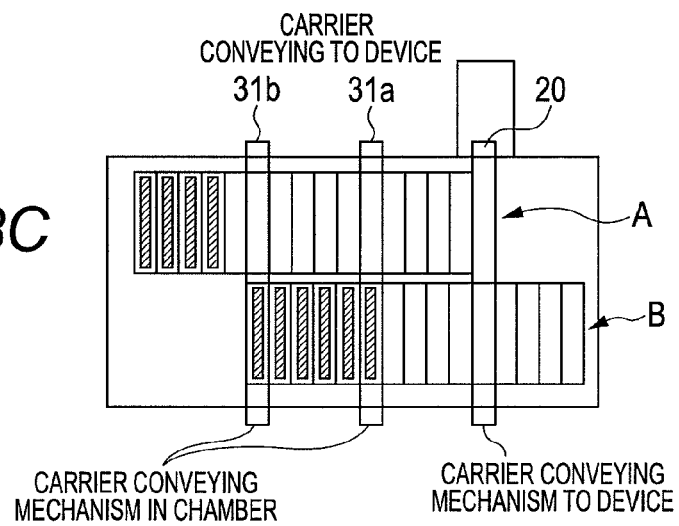
Figure 13D:
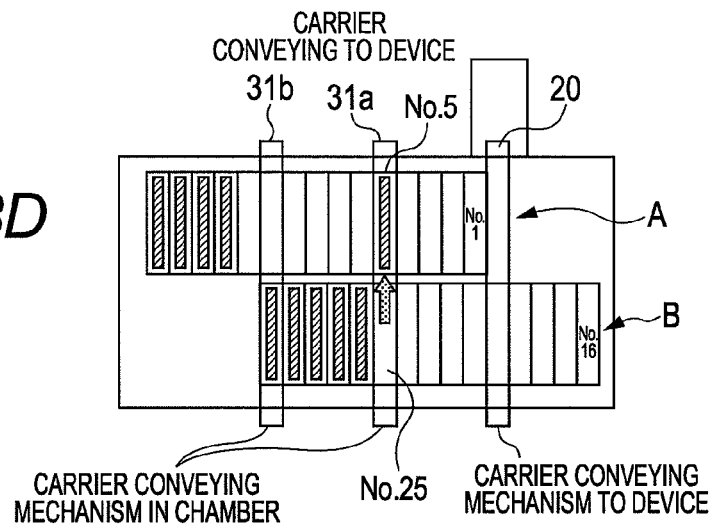
Figure 13E:
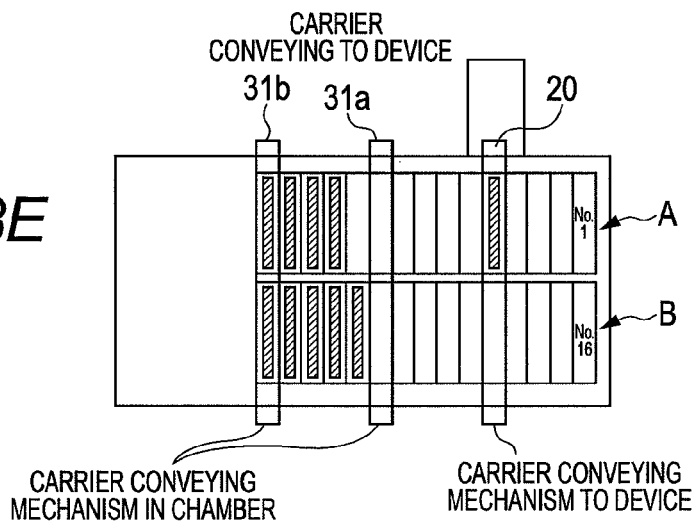

The table rail No. 25 to which the substrate holder 8 has been conveyed is moved to the position above the inter-table transfer mechanism 31*a*, and the table rail No. 5' (empty) on the movable table A is moved to the position above the inter-table transfer mechanism 31*a* (see FIG. 13C). Thereafter, the inter-table transfer mechanism 31*a* is lifted to convey the substrate holder 8 from the table rail No. 25 on the movable table B to the table rail No. 5 on the movable table A (see FIG. 13D). The substrate holder 8 conveyed to the table rail No. 5 is moved to the position to which the inter-device conveying mechanism 20 is allowed to transfer. This makes it possible to convey the substrate holder to the deposition device (see FIGS. 13E and 13F).

Referring to FIGS. 14A to 14F, operations for carrying out the substrate holder stored in the table rail No. 30 to the deposition device will be described. In this case, the conveying is repeatedly performed a plurality of times using the inter-table transfer mechanisms 31*a* and 31*b* to change positions of the substrate holders 8 held on the movable tables A and B.

Figure 14A:
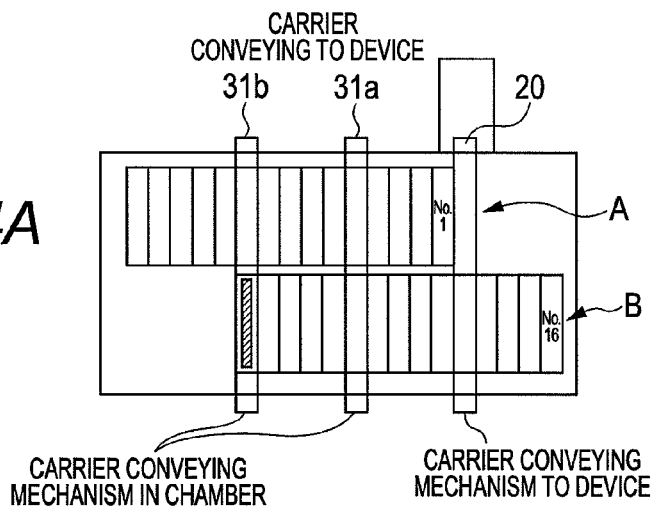
FIGS. 14A to 14F are explanatory views of conveying operations (sequence) of the substrate holders according to the embodiment of the present invention.
Figure 14B:
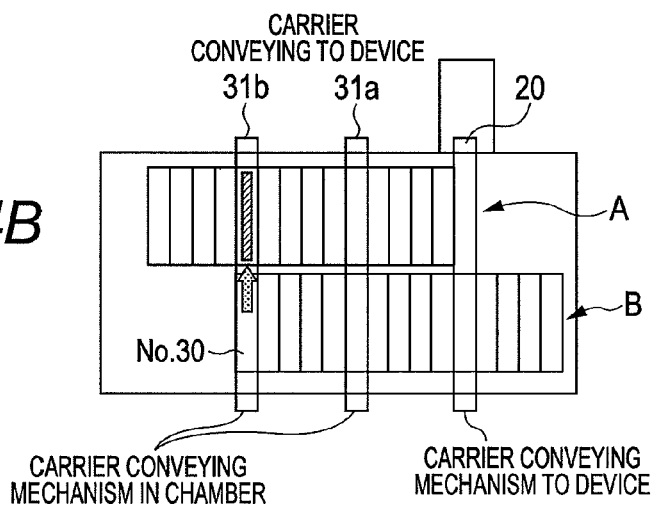
Figure 14C:
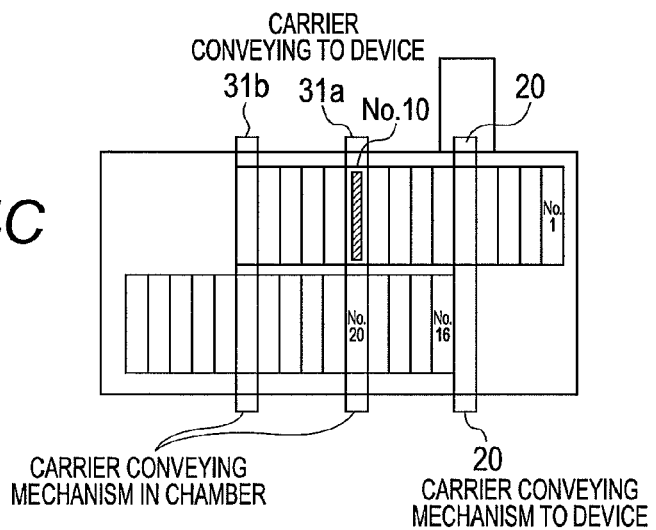
Figure 14D:
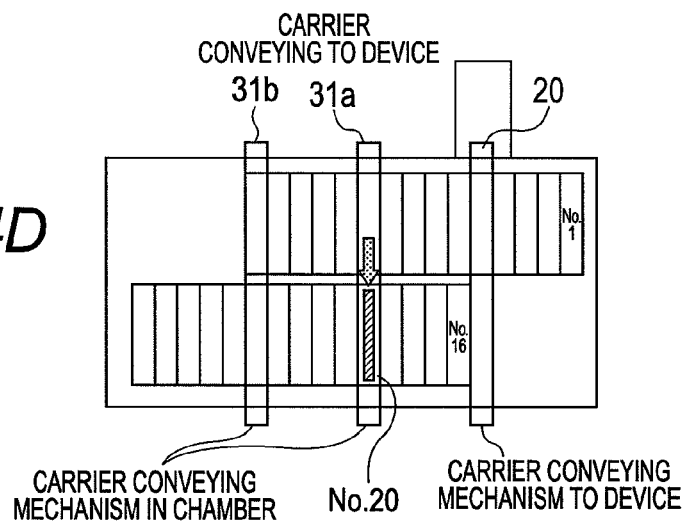
Figure 14E:
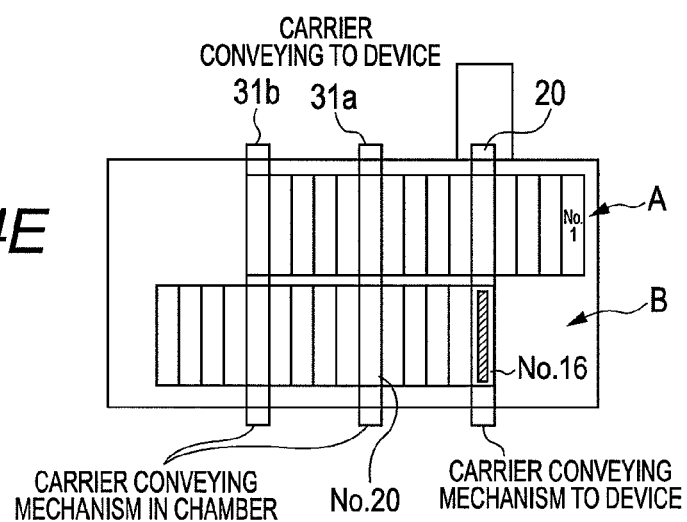
Figure 14F:
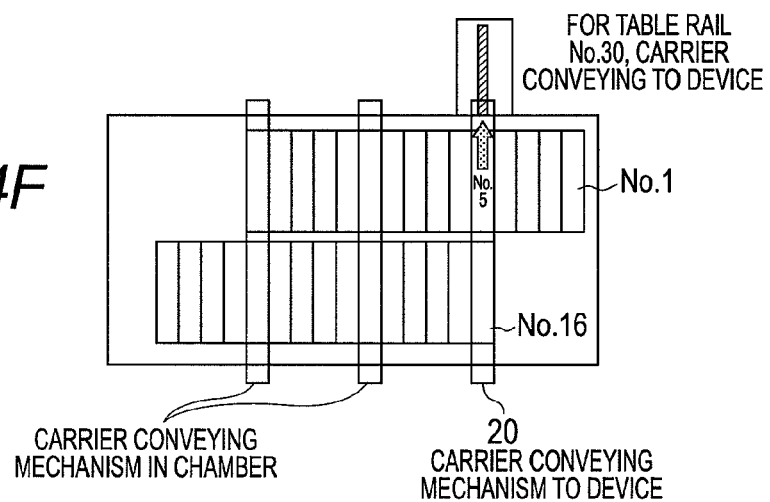

The table rail No. 30 on the movable table B and the table rail No. 10 on the movable table A are moved to the positions above the inter-table transfer mechanism 31*b*, so that the substrate holder 8 is conveyed from the table rail No. 30 to the table rail No. 10 (see FIGS. 14A and 14B). Then the table rail No. 10 on the movable table A and the table rail No. 20 on the movable table B are moved to the positions above the inter-table transfer mechanism 31*a*, so that the substrate holder 8 is conveyed from the table rail No. 10 to the table rail No. 20 (see FIGS. 14C and 14D).

Figure 13F:
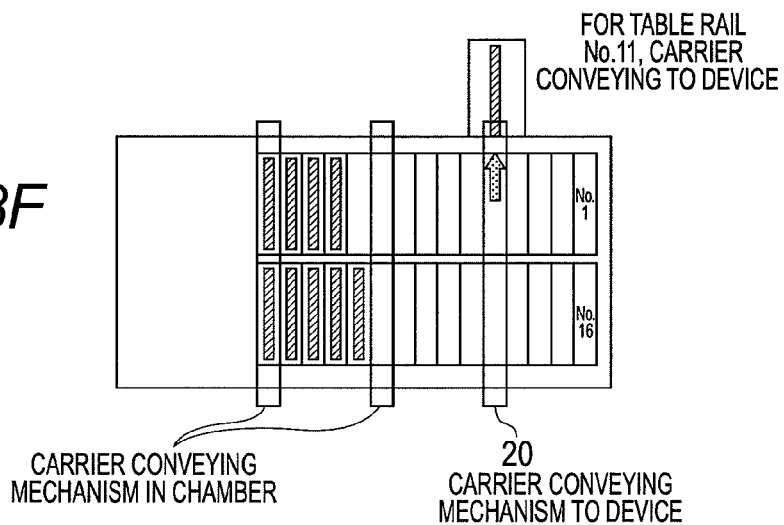

The substrate holder 8 held by the table rail No. 20 on the movable table B is moved to the position to which the inter-device conveying mechanism 20 is allowed to transfer so as to be carried out to the deposition device likewise the operation shown in FIG. 13F (see FIG. 13F). The substrate holder 8 held by the table rail No. 20 on the movable table B may be carried out to the deposition device after the transfer to the table rail No. 16 on the movable table B (see FIGS. 14E and 14F). The substrate holder stocker chamber 18 is capable of carrying out the substrate holder 8 held by any one of the table rails (Nos. 1 to 30) to the deposition device (direction changing chamber 17).

Upon collection of the substrate holder 8 which has been conveyed from the deposition device (direction changing chamber 17) in the substrate holder stocker chamber 18, the collected substrate holder 8 can be held by arbitrary table rail (Nos. 1 to 30). In this case, the table rails on the movable tables A and B are partially set as the empty rails which do not store the substrate holders 8 to allow the substrate holders to be sequentially carried out, carried in, and jump transferred. The term "empty rail" denotes the table rail which temporarily holds the substrate holder 8 to be stored in the other rail. Arbitrary table rail may be set as the empty rail.

Figure 15:
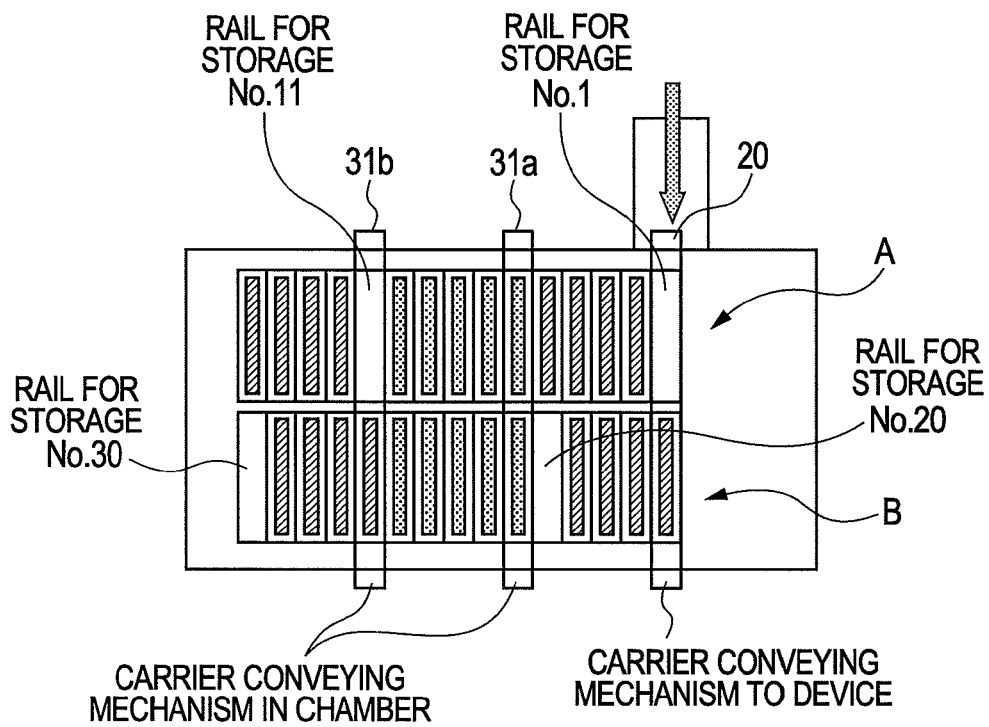
FIG. 15 is an explanatory view of conveying operation (sequence) of the substrate holders according to the embodiment of the present invention.

For example, as FIG. 15 shows, the table rails Nos. 1, 11, 20 and 30 are set as those for storing no substrate holders (empty rails). The substrate holder 8 collected from the deposition device can be conveyed to the storage rail 30 (innermost section) only through the empty rails. Specifically, the substrate holder 8 collected from the deposition device is received by the table rail No. 1, and thereafter, it is moved to the table rail No. 20 through longitudinal operation of the movable table B and the inter-table transfer mechanism 31a. Then, longitudinal operation of the movable table A and the inter-table transfer mechanism 31a move the substrate holder from the table rail No. 20 to the table rail No. 11. Likewise, the longitudinal operation of the movable table B and the inter-table transfer mechanism 31b move the substrate holder to the table rail No. 30. The above-described sequence allows the substrate holder 8 to be collected and stored in the arbitrarily positioned table rail if the substrate holder 8 is stored in the table rail except the empty table rails as described above.

Figure 16A:
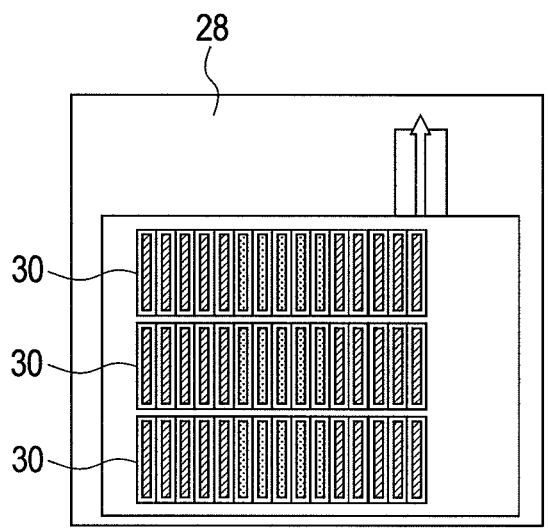
FIGS. 16A and 16B illustrate another exemplary structure of the substrate holder stocker chamber according to the embodiment of the present invention.
Figure 16B:
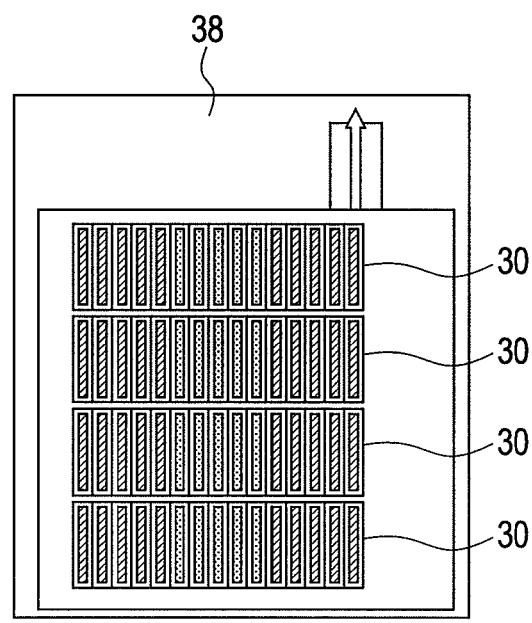

Another exemplary structure of the substrate holder stocker chamber 18 according to the embodiment will be described. The above-described substrate holder stocker chamber 18 includes two movable tables (A and B). However, a plurality of movable tables further allows increase in the number of the substrate holders 8 for storage. For example, the substrate holder stocker chambers 28 and 38 may be provided with three and four movable tables, respectively as shown in FIGS. 16A and 16B. Increase in the number of the inter-table transfer mechanisms 31 may reduce the movable range of each of the movable tables, thus further saving the space.

The present invention includes at least two movable tables (movable holding units) each configured to have a plurality of substrate holders aligned along the first direction which intersects the direction of gravitational force, so that each of those movable tables can move back and forth in the first direction. The respective movable tables capable of moving back and forth in the first direction (longitudinal direction) are allowed to hold the substrate holders, and include the table rails (substrate holding region as the predetermined holding position) which are structured to move the substrate holders in the direction different from the first direction (for example, the direction orthogonal to the first direction). Each of the movable tables has an inter-table transfer mechanism (transfer unit between movable holding units) which moves the substrate holder held on one of the movable tables to the other movable table so as to be held thereby between adjacent movable tables. In the above-described structure, the controller (for example, controller 100) executes the control to move those two movable tables in the first direction so that the table rail for holding the substrate holder to be conveyed on the movable table and the table rail on the movable table adjacent to the aforementioned movable table are correlated with the inter-table transfer mechanism. This makes it possible to locate the substrate holders at the desired position on the plurality of movable tables in the substrate holder stocker chamber. Furthermore, the substrate holder provided at any of the positions on the plurality of movable tables may be conveyed outside the substrate holder stocker chamber.

Figure 17:
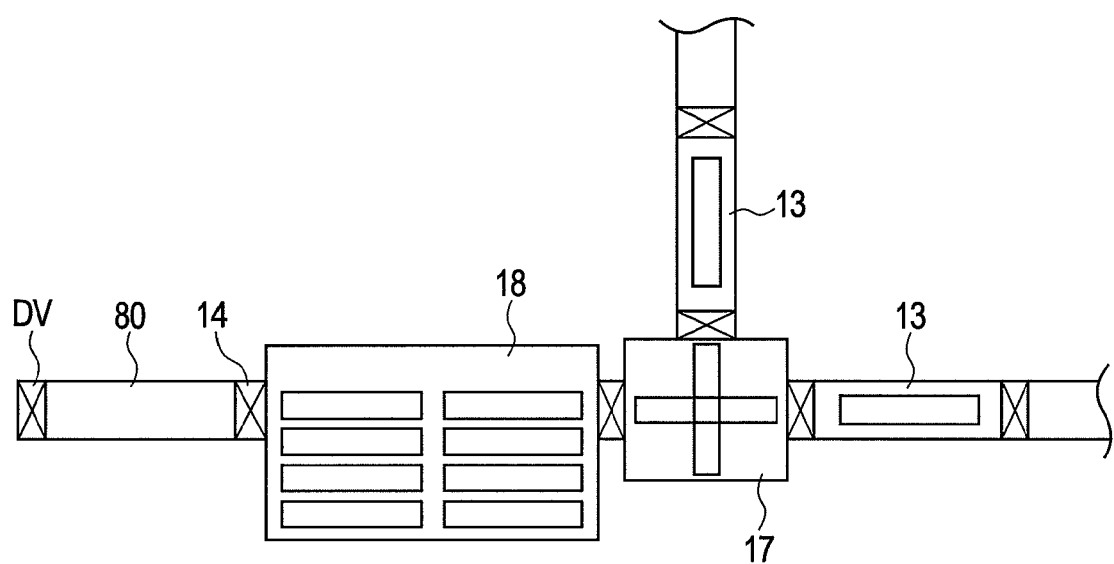
FIG. 17 illustrates another exemplary structure of the substrate holder stocker chamber according to the embodiment of the present invention.

FIG. 17 shows the state where an insertion chamber 80 is attached to the substrate holder stocker chamber 18. The insertion chamber 80 comprises a door valve DV which can be opened to the atmospheric side, and is connected to the substrate holder stocker chamber 18 via the gate valve 14. Connection of the insertion chamber 80 to the substrate holder stocker chamber 18 allows direct carry-in/carry-out of the substrate holder 8 to/from the substrate holder stocker chamber 18 from the atmospheric side. This makes it possible to add/take the substrate holder 8 to/from the deposition device while keeping the vacuum state of the substrate holder stocker chamber 18.

The substrate holder 8 is held while being vertically arranged (height direction) without being arranged in the plane inside the substrate holder stocker chamber for the purpose of reducing the space. The heater 4 for heating the substrate holder 8 can be provided on the side wall surface, or the mechanism capable of moving the heater 4 can be provided to reduce the distance from the substrate holder 8 so as to improve the heating efficiency.

FIG. 18 schematically shows an inter-table transfer mechanism 51 (inter-table transfer unit) according to another embodiment of the present invention. The inter-table transfer mechanism 51 may be employed instead of using the inter-table transfer mechanism 31. The inter-table transfer mechanism 51 is attached to the predetermined table rail 30a on the movable table 30 (movable tables A and B), and includes the conveying rollers 63 serving as the propulsion units, and a drive unit 65 for driving the conveying rollers 63. It is structured without using the vertical moving mechanism 61 and the guide roller 40.

FIG. 18 shows the single table rail 30a provided with the inter-table transfer mechanism 51. All the table rails 30a may be provided with the corresponding inter-table transfer mechanisms 51. The inter-table transfer mechanism 51 has the conveying roller 63 constantly in contact with the substrate holder 8. This makes it possible to feed the substrate holder 8 to the other movable table 30 at the arbitrary timing. In the state where the substrate holder 8 is kept immobilized, the conveying rollers 63 are fixed. The controller 100 controls a drive unit 65A provided at a table rail 30aA on the movable table A to rotate a conveying roller 63A attached to the table rail 30aA. Simultaneously, the controller 100 controls a drive unit 65B attached to a table rail 30aB on the movable table B positioned in the direction at which a table rail 30aA orthogonally intersects with the first direction to rotate a conveying roller 63B attached to the table rail 30aB. That is, the conveying rollers 63A and 63B are rotated in conjunction with each other. This makes it possible to convey the substrate holder 8 from the table rail 30aA to the table rail 30aB.

The conveying roller 63 is used as the propulsion unit for the inter-table transfer mechanism 51. The linear motor may be provided at the position facing the permanent magnet 11a. Use of the linear motor as the propulsion unit is further effective for reducing the particle because the propulsion unit is kept contactless with the substrate holder 8. When all the table rails 30a are provided with the corresponding inter-table transfer mechanisms 51, a plurality of substrate holders 8 may be simultaneously transferred.

What is claimed is:

1. A substrate holder stocker device for storing substrate holders to be transferred in a process chamber that performs a vacuum processing on a substrate, comprising:
   a chamber which is connected with the process chamber;
   a first movable holding unit which is provided in the chamber and configured to allow holding of a plurality of the substrate holders side by side in a first direction in a plane intersecting a direction of gravitational force, and which can move back and forth in the first direction;
   a second movable holding unit which is provided parallel to the first movable holding unit in the chamber and configured to allow holding of a plurality of the substrate holders side by side in the first direction, and which can move back and forth in the first direction; and
   two or more inter-table transfer units, each of which is provided in the chamber and configured to move one of the substrate holders held at a predetermined holding position of one of the first and the second movable holding units in a horizontal direction orthogonal to the first direction in the plane, so as to make an other of the first and the second movable holding units hold the one of the substrate holders when the first and the second movable holding units are stopped at predetermined positions, wherein the first movable holding unit and the second movable holding unit are configured to move in parallel and independently along the first direction in a state where the first movable holding unit has a portion overlapping the second movable holding unit in the horizontal direction orthogonal to the first direction in the plane, and wherein the two or more inter-table transfer units are configured to be located below the overlapping portion in the direction of gravitational force.

2. A substrate holder stocker device according to claim 1, further comprising an inter-device transfer unit which transfers the one of the substrate holders which is held by one of the first and the second movable holding units between the process chamber and the substrate holder stocker device.

3. A substrate holder stocker device according to claim 1,
wherein each of the inter-table transfer units includes a propulsion unit which has a plurality of conveying rollers and simultaneously rotates the conveying rollers, and is configured to be movable between a first position at which the one of the substrate holders held by the first and the second movable holding units contacts the conveying rollers, and a second position other than the first position; and
wherein when the first and the second movable holding units are stopped at the predetermined positions, one of the inter-table transfer units moves to a position at which the conveying rollers contact the one of the substrate holders held at a predetermined position of one of the first and the second movable holding units.

4. A substrate holder stocker device according to claim 1,
wherein each of the inter-table transfer units includes a propulsion unit which has a plurality of conveying rollers and simultaneously rotates the conveying rollers;
wherein the conveying rollers are provided in each of the first and the second movable holding units; and
wherein when the first and the second movable holding units are stopped at the predetermined positions, the conveying rollers provided on the first movable holding unit operate in conjunction with the conveying rollers provided on the second movable holding unit, the conveying rollers provided on the first movable holding unit facing the conveying rollers provided on the second movable holding unit in the horizontal direction orthogonal to the first direction.

5. A substrate holder stocker device according to claim 1, further comprising a heating unit provided in the chamber, and configured to heat the substrate holders held by the first or the second movable holding unit.

6. A substrate processing apparatus, comprising:
the substrate holder stocker device according to claim 1;
a substrate transfer chamber for transferring a substrate to the one of the substrate holders; and
a process chamber for conveying the substrate mounted on the one of the substrate holders and performing a vacuum processing.

7. A substrate holder moving method comprising the steps of:
providing the substrate holder stocker device according to claim 1;
performing, by the substrate holder stocker device, a first operation of moving at least one of the first and the second movable holding units in the first direction; and
performing, by the substrate holder stocker device, a second operation of moving the one of the substrate holders between the first and second movable holding units by one of the inter-table transfer units,
wherein a holding position of the one of the substrate holders in the first or the second movable holding unit is arbitrarily moved by alternately performing the first operation and the second operation.

* * * * *